US011988360B1

(12) United States Patent
Doble

(10) Patent No.: US 11,988,360 B1
(45) Date of Patent: May 21, 2024

(54) SELF-BUILD SOLAR LIGHT KIT

(71) Applicant: SolarBuddy.org Ltd, Morningside (AU)

(72) Inventor: Simon James Doble, Teneriffe (AU)

(73) Assignee: Solarbuddy.org Ltd, Morningside (AU)

( * ) Notice: Subject to any disclaimer, the term of this patent is extended or adjusted under 35 U.S.C. 154(b) by 0 days.

(21) Appl. No.: 18/053,954

(22) Filed: Nov. 9, 2022

(51) Int. Cl.
| F21S 9/03 | (2006.01) |
| F21L 4/08 | (2006.01) |
| F21V 23/04 | (2006.01) |
| F21Y 115/10 | (2016.01) |
| H01R 43/26 | (2006.01) |
| H05K 5/00 | (2006.01) |

(52) U.S. Cl.
CPC .......... *F21S 9/032* (2013.01); *F21L 4/08* (2013.01); *F21V 23/04* (2013.01); *H05K 5/0026* (2013.01); *H05K 5/0086* (2013.01); *F21Y 2115/10* (2016.08); *H01R 43/26* (2013.01)

(58) Field of Classification Search
CPC .......... F21S 9/032; F21L 4/08; H05K 5/0026; H05K 5/0086
See application file for complete search history.

(56) References Cited

U.S. PATENT DOCUMENTS

| 7,088,222 B1* | 8/2006 | Dueker | F21L 4/08 |
| | | | 362/153.1 |
| 7,513,638 B2 | 4/2009 | Allsop et al. | |
| 9,016,886 B2* | 4/2015 | Snyder | F21L 4/08 |
| | | | 362/183 |
| 9,080,736 B1 | 7/2015 | Salzinger et al. | |
| 10,180,221 B1* | 1/2019 | Jeong | F21L 4/027 |
| 2007/0297167 A1 | 12/2007 | Greenhoe | |
| 2009/0036018 A1 | 2/2009 | Woessner et al. | |
| 2013/0076269 A1* | 3/2013 | Shilton | H05B 47/17 |
| | | | 315/362 |
| 2015/0176782 A1 | 6/2015 | Mclennan et al. | |

(Continued)

OTHER PUBLICATIONS

Clare. (Jan. 31, 2022). "Back to School with 3 STEM programs to kick off 2022!" located at: https://solarbuddy.createsend.com/t/ViewEmail/j/4BB2DA1A1E09F9922540EF23F30FEDED/C67FD2F38AC4859C/? tx=0&previewAll=1&print=1&source=PrintPreview&context=BE1559E32AC7F640D744A813E2B67A32. (3 pages).

(Continued)

*Primary Examiner* — William N Harris
(74) *Attorney, Agent, or Firm* — Morrison & Foerster LLP

(57) ABSTRACT

Disclosed herein is a solar light kit and a method of assembling the solar light kit, the kit comprising: a printed circuit board (PCB) housing configured to enclose a first PCB and second PCB, wherein the first PCB comprises an array of light sources and the second PCB comprises a plurality of electrical ports, the first PCB and second PCB are configured to connect and fit in the PCB housing in one orientation; a battery housing configured to enclose at least one rechargeable battery, wherein the battery housing is configured to connect to the PCB housing; a casing configured to enclose the connected PCB housing and battery housing; and a solar panel configured to connect to the second PCB using a connector cable removably connectable to the solar panel and the second PCB.

20 Claims, 15 Drawing Sheets

(56) References Cited

U.S. PATENT DOCUMENTS

| | | | |
|---|---|---|---|
| 2015/0219294 A1* | 8/2015 | Sreshta | F21V 23/005 362/96 |
| 2017/0198873 A1 | 7/2017 | Ashmore et al. | |
| 2017/0299159 A1 | 10/2017 | Mjelde | |
| 2020/0124240 A1 | 4/2020 | Jeong et al. | |
| 2023/0400160 A1 | 12/2023 | Doble | |

OTHER PUBLICATIONS

SolarBuddy.org Ltd. (Sep. 6, 2022). "The new life-changing innovative solution to lift children out of energy poverty," located at: https://solarbuddy.org/US/news/the-new-life-changing-innovative-solution-to-lift-children-out-of-energy-poverty/. (8 pages).

Admin SolarBuddy. (Apr. 28, 2016) "SolarBuddy Children," located at https://www.youtube.com/watch?v=3Vh6TjPvh2Q. (1 page).

Admin SolarBuddy. (Mar. 23, 2017) "SolarBuddy and Earth Hour on Toasted TV," located at https://www.youtube.com/watch?v=NSQC8w3r7k4. (1 page).

Admin SolarBuddy. (Nov. 11, 2016) "SolarBuddy featuring on Totally Wild—Network Ten," located at https://www.youtube.com/watch?v=e2si_5M8n1g. (1 page).

Casey Briggs. (Aug. 1, 2016) "Solar Buddy," located at https://www.youtube.com/watch?v=InqmbE75UE8. (1 page).

Doble, U.S. Office Action mailed Apr. 20, 2023, directed to U.S. Appl. No. 17/838,972; 24 pages.

Home Education Association, Inc. (May 14, 2021) "SolarBuddy", located at https://www.hea.edu.au/solarbuddy. (11 pages).

International Search Report and Written Opinion mailed Dec. 8, 2023, directed to International Application No. PCT/US2023/077276; 5 pages.

International Search Report and Written Opinion mailed Jun. 15, 2023, directed to International Application No. PCT/US2023/020664; 11 pages.

SolarBuddy. (Feb. 9, 2020) "Our JuniorBuddy Program—SolarBuddy," located at https://www.youtube.com/watch?v=DrZyTjCynaw. (1 page).

SolarBuddy. (May 25, 2020) "Brisbane Girl Guides Illuminating Futures," located at https://www.youtube.com/watch?v=Id_K-zRiydk. (1 page).

SolarBuddy. (Nov. 23, 2020) "Yellow Bucket Features", located at https://www.youtube.com/watch?v=sWk_IA4JATA. (1 page).

SolarBuddy. org Ltd. (Dec. 19, 2021), located at https://www.facebook.com/solarbuddy.org/photos/pb. 100057692464051.-2207520000./1538965249814913/?type=3. (1 page).

SolarBuddyThailand. (Nov. 11, 2018), located at https://www.solarbuddythailand.org/. (2 pages).

* cited by examiner

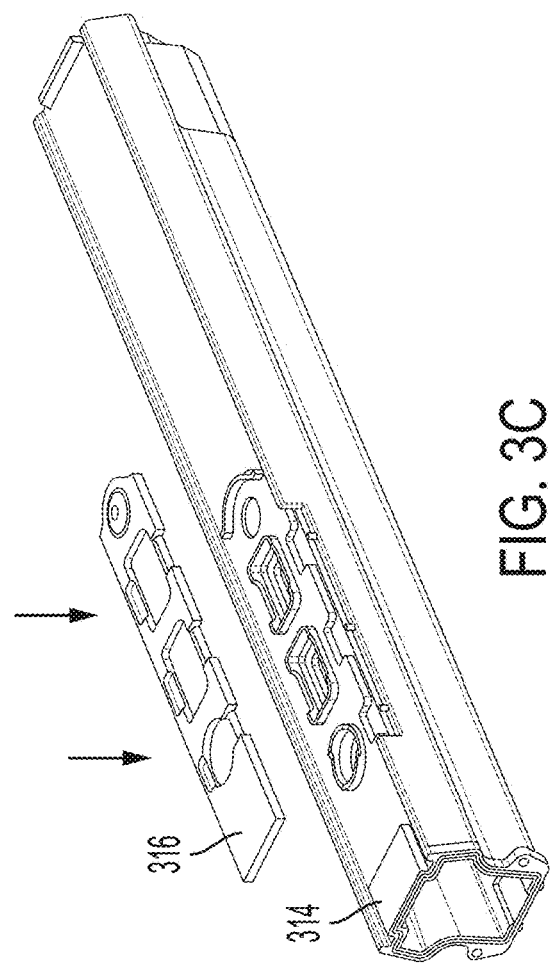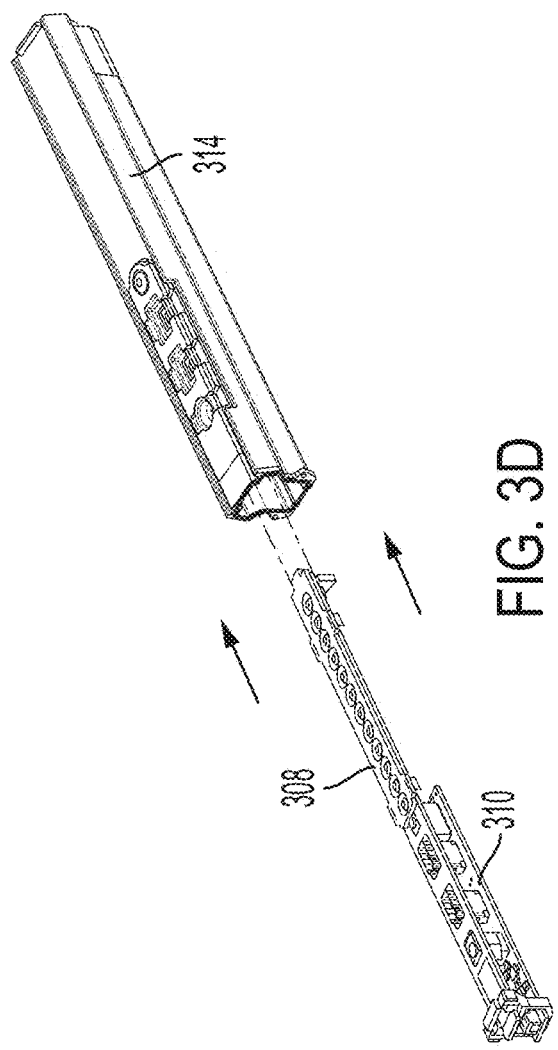

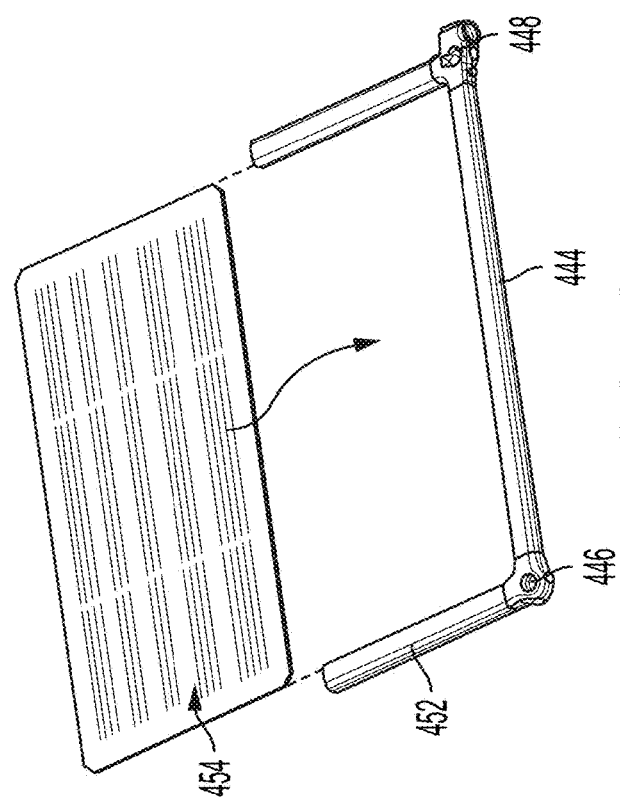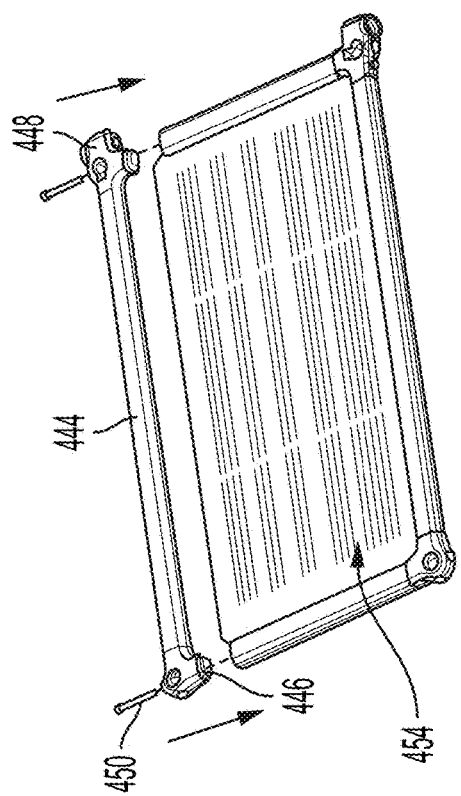

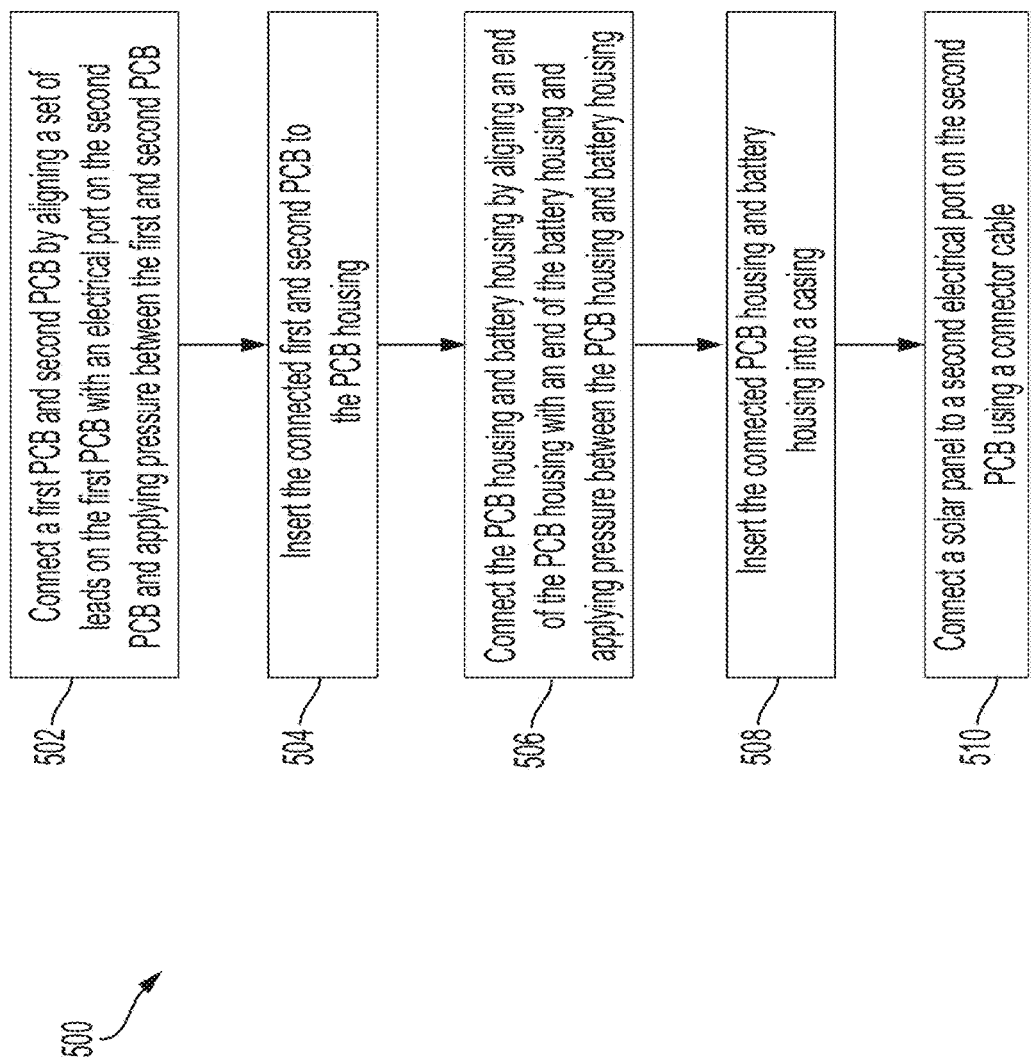

SELF-BUILD SOLAR LIGHT KIT

FIELD

This disclosure relates generally to solar lights, and more specifically to a solar light kit designed to be constructed by children.

BACKGROUND

Students, especially young children, are more frequently educated using virtual resources, leaving limited room for hands-on activities. More specifically, many young students are not provided opportunities to participate in fundamental, practical engineering projects. Additionally, children in education systems are often unaware of the lack of energy resources for children their age in developing countries. Energy poverty condemns billions of people to darkness, poor health, unfulfilled futures, and repeated cycles of poverty. Specifically, energy poverty contributes to more deaths of children each year than AIDS and malaria combined. In developing nations, many families do not have resources within their household to charge electronic devices. Thus, people (often children) are required to travel to charging stalls to charge their devices. These charging stalls are typically powered by fossil fuel-powered generators and are not cost-friendly.

SUMMARY

As mentioned above, there has been a shift in the classroom towards an education style that relies heavily on virtual resources. Additionally, many communities in developing countries are living in energy poverty, with limited resources of light as well as power to charge personal devices. Thus, a gap exists in educating children with hands-on, STEM-based (science, technology, engineering, and mathematics) activities, such as building a functional device, while also creating a lasting impact by donating the constructed device to children and families in need in developing countries.

The disclosed solar light kit joins two communities—those living in energy poverty and those in need of improved educational tools—by providing a system in which children have the opportunity to learn, build, and donate a solar light device to communities with limited energy resources. The program includes learning about solar lights and energy poverty in developing countries, building a solar light device from a kit with instructions, and donating the solar light to a child in need. The learning experience may additionally include the opportunity to write a letter to accompany the donated solar light to the child receiving the device. Children and families living in energy poverty may intuitively operate the light to complete schoolwork, work, play, and travel in an otherwise dark environment, thereby improving their living standard. The knowledge gained not only from learning how to construct a solar light but also from spreading awareness of energy poverty also contributes to the education of children in developed countries. Additionally, in obtaining the solar light, children in developing countries can learn about solar light systems and learn how to maintain their personal device, thereby improving children's education in developing countries, too.

The disclosed solar light kit may include various custom-shaped, modular, removably connectable components for building a solar panel and torch-style solar light that may be used in a variety of situations. Once constructed, the solar panel device and the solar light device may be electrically connected (e.g., via a cable) to transfer energy generated by the solar panel to the solar light device to power light sources on the solar light device. In some embodiments, the torch-style solar light may include one or more charging ports for charging other devices (e.g., mobile devices, such as phones, tablets, etc.). The solar panel and light may be portable and constructed from materials that are environmentally sustainable, lightweight, and weather-resistant to adverse environmental conditions, such as rain and UV sun exposure.

In some embodiments, a method of assembling a solar light kit is provided, the method comprising: connecting a first printed circuit board (PCB) comprising an array of light sources and a set of leads and a second PCB comprising a plurality of electrical ports, wherein connecting the first PCB and the second PCB comprises aligning the set of leads on the first PCB with a first electrical port of the plurality of electrical ports on the second PCB and applying pressure between the first PCB and second PCB; inserting the connected first PCB and second PCB to a PCB housing, wherein the connected first PCB and second PCB fit within the PCB housing in one orientation; connecting the PCB housing and a battery housing enclosing a rechargeable battery by aligning an end of the PCB housing with an end of the battery housing and applying pressure between the PCB housing and the battery housing; inserting the connected PCB housing and battery housing into a casing; and connecting a solar panel to a second electrical port of the plurality of electrical ports on the second PCB using a connector cable, wherein the connector cable is removably connectable to the solar panel and to the second electrical port.

In some embodiments, the method comprises attaching a lens to the first printed circuit board (PCB), wherein the lens is configured to disperse light from the array of light sources on the first PCB.

In some embodiments, the first printed circuit board comprises a switch configured to activate and deactivate the array of light sources.

In some embodiments, a third electrical port of the plurality of electrical ports on the second printed circuit board is configured to charge a mobile device.

In some embodiments, the first printed circuit board (PCB) comprises one or more through-holes, and a through-hole of the one or more through-holes is configured to receive the second electrical port on the second PCB.

In some embodiments, the method comprises, prior to inserting the connected first printed circuit board (PCB) and second PCB into the PCB housing, attaching an end cap to an end of the connected first PCB and second PCB.

In some embodiments, inserting the connected first printed circuit board (PCB) and second PCB to the PCB housing comprises inserting an end of the connected first PCB and second PCB opposite from the end cap into the PCB housing.

In some embodiments, the method comprises, prior to inserting the connected printed circuit board (PCB) housing and battery housing into the casing, attaching an electrical port plate to the PCB housing by aligning the electrical port plate with a corresponding portion of the PCB housing and applying pressure between the electrical port plate and the PCB housing.

In some embodiments, the electrical port plate comprises one or more through-holes configured to align with one or more electrical ports of the plurality of electrical ports on the second printed circuit board.

In some embodiments, the electrical port plate comprises a button configured to align and engage with a switch on the first printed circuit board.

In some embodiments, the method comprises, prior to inserting the connected printed circuit board (PCB) housing and battery housing into the casing, attaching an electrical port cover to the PCB housing by aligning the electrical port cover with a corresponding portion of the PCB housing and applying pressure between a portion of the electrical port cover and the PCB housing.

In some embodiments, the electrical port cover comprises one or more electrical port caps configured to removably cover one or more electrical ports of the plurality of electrical ports on the second printed circuit board.

In some embodiments, the method comprises, prior to connecting the printed circuit board housing and the battery housing, inserting the rechargeable battery into an end of the battery housing.

In some embodiments, the method comprises, after inserting the rechargeable battery into the end of the battery housing, enclosing the rechargeable battery in the battery housing using one or more end caps.

In some embodiments, enclosing the rechargeable battery in the battery housing comprises inserting a portion of an end cap of the one or more end caps into the end of the battery housing by aligning the portion of the end cap with the end of the battery housing and applying pressure between the end cap and the battery housing.

In some embodiments, connecting the printed circuit board (PCB) housing and the battery housing comprises aligning an end of the battery housing comprising the one or more end caps with an open end of the PCB housing.

In some embodiments, connecting the printed circuit board (PCB) housing and the battery housing comprises connecting a lead extending from the rechargeable battery to the connected first PCB and second PCB.

In some embodiments, the method comprises, prior to inserting the connected printed circuit board housing and battery housing into the casing, connecting a first end cap of a plurality of end caps to a first end of the casing.

In some embodiments, inserting the connected printed circuit board (PCB) housing and battery housing into the casing comprises, after connecting the first end cap to the first end of the casing, inserting the connected PCB housing and battery housing into the casing at a second end of the casing.

In some embodiments, the method comprises, after inserting the connected printed circuit board housing and battery housing into the casing, connecting a second end cap of the plurality of end caps to the second end of the casing.

In some embodiments, connecting the first end cap and second end cap of the plurality of end caps to the casing comprises using at least one handheld tool and a plurality of removable fasteners.

In some embodiments, assembling the solar light kit comprises assembling a solar panel stand and a solar panel frame.

In some embodiments, assembling the solar panel frame comprises connecting a plurality of corner members and a plurality of edge members around a perimeter of the solar panel.

In some embodiments, connecting the plurality of corner members and the plurality of edge members comprises using a plurality of removable fasteners and at least one handheld tool.

In some embodiments, assembling the solar panel stand comprises connecting an arm connecting member to a pair of stand arms.

In some embodiments, connecting the stand connecting member to the pair of stand arms comprises using a plurality of removable fasteners and at least one handheld tool.

In some embodiments, assembling the solar panel comprises connecting the assembled solar panel stand and the solar panel frame.

In some embodiments, connecting the assembled solar panel stand and assembled the solar panel frame comprises using one or more stand connectors, a plurality of removable fasteners, and at least one handheld tool.

In some embodiments, the solar light kit is provided in a kit package comprising a plurality of handheld tools and instructions for assembling the solar light kit.

In some embodiments, a solar light kit is provided, comprising: a printed circuit board (PCB) housing configured to enclose a first PCB and second PCB, wherein the first PCB comprises an array of light sources and a set of leads and the second PCB comprises a plurality of electrical ports, the first PCB and second PCB are configured to connect by aligning the set of leads on the first PCB with a first electrical port of the plurality of electrical ports on the second PCB and applying pressure between the first PCB and the second PCB, and the connected first PCB and second PCB are configured to fit in the PCB housing in one orientation; a battery housing configured to enclose at least one rechargeable battery, wherein the battery housing is configured to connect to the PCB housing by aligning an end of the PCB housing with an end of the battery housing and applying pressure between the PCB housing and the battery housing; a casing configured to enclose the connected PCB housing and battery housing; and a solar panel configured to connect to the second PCB using a connector cable, wherein the connector cable is removably connectable to the solar panel and to the second electrical port on the second PCB, and the PCB housing, the first PCB, the second PCB, the battery housing, the rechargeable battery, the casing, the solar panel, and the connector cable are bundled together unassembled in a kit package.

In some embodiments, the solar light kit comprises a lens configured to attach to the first printed circuit board (PCB) to disperse light generated from the array of light sources on the first PCB.

In some embodiments, the first printed circuit board comprises a switch configured to activate and deactivate the array of light sources.

In some embodiments, a third electrical port of the plurality of electrical ports on the second printed circuit board is configured to charge a mobile device.

In some embodiments, the first printed circuit board (PCB) comprises one or more through-holes, and a through-hole of the one or more through-holes is configured to receive the second electrical port on the second PCB.

In some embodiments, the solar light kit comprises an end cap configured to attach to an end of the connected first printed circuit board (PCB) and second PCB.

In some embodiments, the connected first printed circuit board (PCB) and second PCB are configured to be inserted into the PCB housing at an end of the connected first PCB and second PCB opposite from the end cap.

In some embodiments, the solar light kit comprises an electrical port plate configured to attach to the printed circuit board (PCB) housing by aligning the electrical port plate with a corresponding portion of the PCB housing and applying pressure between the electrical port plate and the PCB housing.

In some embodiments, the electrical port plate comprises one or more through-holes configured to align with one or more electrical ports of the plurality of electrical ports on the second printed circuit board.

In some embodiments, the electrical port plate comprises a button configured to align and engage with a switch on the first printed circuit board.

In some embodiments, the solar light kit comprises an electrical port cover configured to attach to the printed circuit board (PCB) housing by aligning the electrical port cover with a corresponding portion of the PCB housing and applying pressure between a portion of the electrical port cover and the PCB housing.

In some embodiments, the electrical port cover comprises one or more electrical port caps configured to removably cover one or more electrical ports of the plurality of electrical ports on the second printed circuit board.

In some embodiments, the solar light kit comprises one or more end caps configured to be inserted into an end of the battery housing to enclose the rechargeable battery in the battery housing.

In some embodiments, enclosing the rechargeable battery in the battery housing comprises inserting a portion of an end cap of the one or more end caps into the end of the battery housing by aligning the portion of the end cap with the end of the battery housing and applying pressure between the end cap and the battery housing.

In some embodiments, connecting the printed circuit board (PCB) housing and the battery housing comprises aligning the end of the battery housing comprising the one or more end caps with an open end of the (PCB) housing.

In some embodiments, the rechargeable battery comprises a lead extending from the battery, the lead configured to connect to the connected first printed circuit board (PCB) and second PCB.

In some embodiments, the solar light kit comprises a first end cap of a plurality of end caps configured to connect to a first end of the casing.

In some embodiments, the connected printed circuit board (PCB) housing and battery housing are configured to be inserted into the casing at a second end of the casing.

In some embodiments, the solar light kit comprises a second end cap of the plurality of end caps configured to connect to a second end of the casing.

In some embodiments, the solar light kit comprises at least one handheld tool and a plurality of removable fasteners configured to connect the first end cap and second end cap of the plurality of end caps to the casing.

In some embodiments, the solar panel comprises a solar panel frame and a solar panel stand configured to be assembled.

In some embodiments, the solar panel frame comprises a plurality of corner members and a plurality of edge members configured to surround a perimeter of the solar panel.

In some embodiments, the plurality of corner members and the plurality of edge members are configured to connect around the perimeter of the solar panel using a plurality of removable fasteners and at least one handheld tool.

In some embodiments, the solar panel stand comprises a pair of stand arms and an arm connecting member configured to connect the pair of stand arms.

In some embodiments, the arm connecting member and the pair of arms are configured to connect using a plurality of removable fasteners and at least one handheld tool.

In some embodiments, the assembled solar panel stand and the assembled solar panel frame are configured to connect using one or more stand connectors, a plurality of removable fasteners, and at least one handheld tool.

In some embodiments, the kit package comprises a plurality of handheld tools and instructions for assembling the solar light kit.

In some embodiments, a solar light kit is provided, comprising: a solar light device comprising a first printed circuit board (PCB), a second PCB, and a rechargeable battery, wherein the first PCB comprises an array of light sources and a lens, and the second PCB comprises a plurality of electrical ports, wherein a first electrical port of the plurality of electrical ports is configured to receive a connector cable, and a second electrical port of the plurality of electrical ports is configured to receive a charging cable for charging a mobile device; and a solar panel device comprising a frame and a stand, wherein the solar panel device is configured to removably connect to the solar light device using the connector cable.

In some embodiments, the solar light device comprises a rectangular prism shape configured to be handheld for a human.

In some embodiments, the array of light sources on the first printed circuit board (PCB) and the plurality of electrical ports on the second PCB are disposed on a face of the solar light device.

In some embodiments, the array of light sources comprises a plurality of light emitting diodes (LEDs).

In some embodiments, the solar light device comprises a third electrical port configured to receive the charging cable for charging a mobile device.

In some embodiments, the second electrical port and third electrical port comprise a universal serial bus (USB) port.

In some embodiments, the first electrical port comprises a direct current (DC) barrel jack.

In some embodiments, the solar light device comprises an electrical port cover comprising a plurality of caps configured to removably cover the plurality of electrical ports on the second printed circuit board.

In some embodiments, the first printed circuit board comprises a button configured to activate and deactivate the array of light sources.

In some embodiments, engaging with the button toggles between a plurality of light illumination settings for the array of light sources.

In some embodiments, the connector cable is at least 2 meters in length.

In some embodiments, the solar panel device is a polycrystalline panel comprising a plurality of solar cells.

BRIEF DESCRIPTION OF FIGURES

The invention will now be described, by way of example only, with reference to the accompanying drawings, in which:

FIGS. 4A-4H show assembly steps of a solar panel of the solar light kit, in accordance with some embodiments.

FIG. 5 shows a method for assembling a solar light from a solar light kit, in accordance with some embodiments.

DETAILED DESCRIPTION

Reference will now be made in detail to implementations and embodiments of various aspects and variations of systems and methods described herein. Although several exemplary variations of the systems and methods are described herein, other variations of the systems and methods may include aspects of the systems and methods described herein combined in any suitable manner having combinations of all or some of the aspects described.

The disclosed solar light kit may comprise a modular solar panel device and a torch-style solar light device removably connected (e.g., via a cable) to transfer energy generated by the solar panel to the solar light. The solar light may comprise a rechargeable battery configured to receive the energy generated by the solar panel and provide power to the light sources of the solar light device. The solar light may comprise one or more charging ports for providing power stored from the solar panel to one or more personal devices (e.g., mobile devices, phones, tablets, etc.). One or more components of the solar light kit may be specifically designed to be assembled by children with a limited number of handheld tools, and without the use of solder, glue, or other adhesives. Additionally, the components for building the solar panel and solar light may be manufactured such that each piece must be assembled in a particular order and orientation. The torch-style solar light may be sized such that it is handheld and portable for a child when disconnected from the solar panel. The solar panel of the solar light kit may comprise a stand, which allows the device to be stood/hung in any preferred orientation.

In the following description of the various embodiments, it is to be understood that the singular forms "a," "an," and "the" used in the following description are intended to include the plural forms as well, unless the context clearly indicates otherwise. It is also to be understood that the term "and/or" as used herein refers to and encompasses any and all possible combinations of one or more of the associated listed items. It is further to be understood that the terms "includes," "including," "comprises," and/or "comprising," when used herein, specify the presence of stated features, integers, steps, operations, elements, components, and/or units but do not preclude the presence or addition of one or more other features, integers, steps, operations, elements, components, units, and/or groups thereof.

Characteristics of a Solar Light Kit

Figure 1:
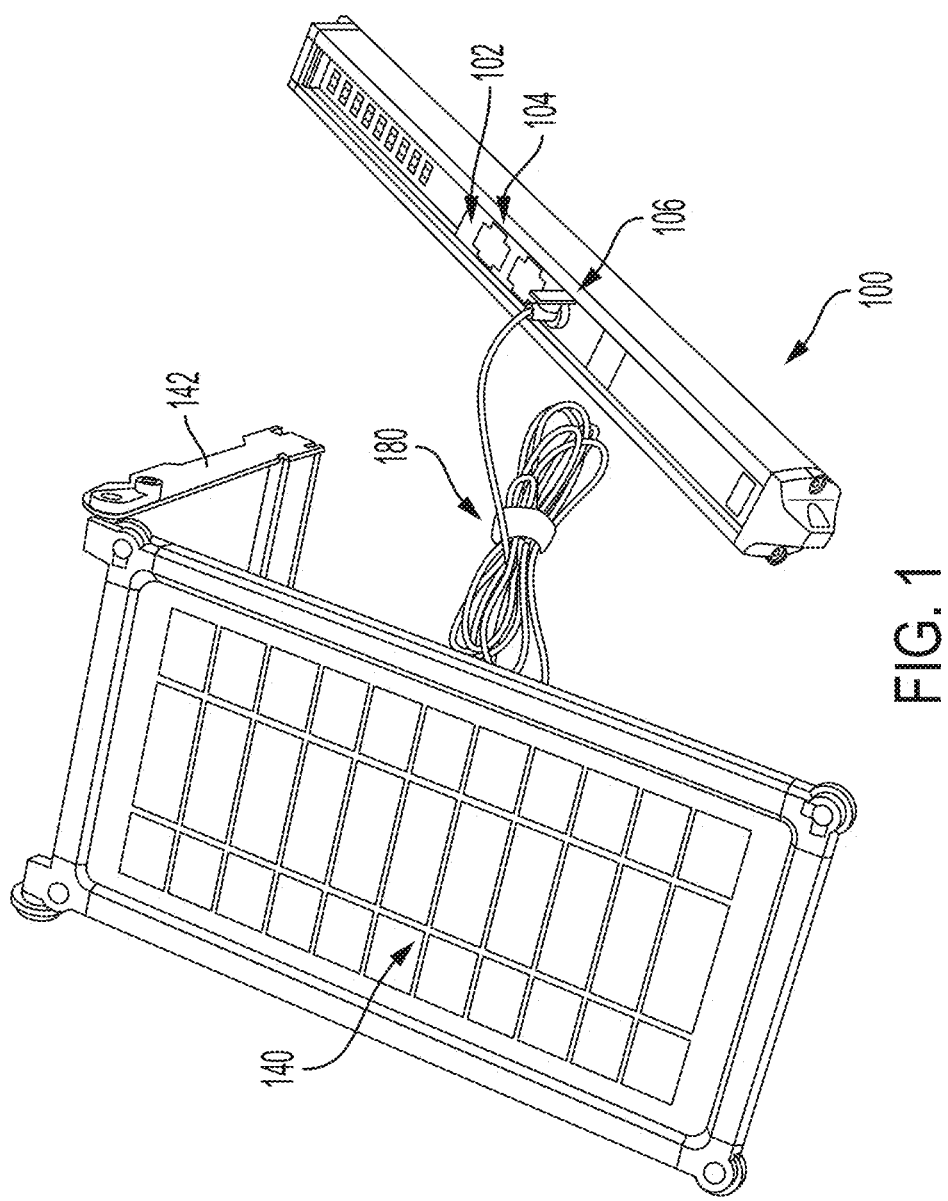
FIG. 1 shows a prospective view of a constructed solar panel and solar light, in accordance with some embodiments.

FIG. 1 illustrates an assembled and connected solar panel and solar light, in accordance with some embodiments. Solar light 100 may comprise one or more features including a button 102 configured to toggle between states of the solar light, one or more charging ports 104, and an electrical port 106 configured to receive an electrical connector (e.g., cable 180) for transferring energy (e.g., electricity) generated by the solar panel to components within the solar light 100.

In some embodiments, button 102 may be configured to activate and deactivate the solar light (e.g., the light sources of the solar light). For example, a user may engage with button 102 by pressing the button a first time to turn on the light, and a second time to turn off the light. In some embodiments, solar light 100 may comprise a plurality of light settings. For example, the solar light may be configured to emit light in a variety of colors (e.g., red, green, blue, white, yellow, etc.) and/or at a plurality of intensities (e.g., low, medium, and high brightness). In some embodiments, the user may engage with button 102 to toggle between these light settings. For example, the user may press button 102 a first time to turn the light on, and by pressing and holding the button for a predefined amount of time (e.g., 1, 2, 3, or more seconds), the color and/or brightness of the light may be altered. In some embodiments, the user may toggle between light settings by pressing button 102 repeatedly.

In some embodiments, the duration that solar light 100 may illuminate with a full solar charge from a solar panel (e.g., solar panel 140) may be dependent on the intensity of light being provided. For example, at a low brightness (e.g., at or around 50 lumens), solar light 100 may be configured to provide at least 30, 35, 40, 45, 50, or more hours of light through an array of light sources. In some embodiments, at a high brightness (e.g., at or around 240 lumens), solar light 100 may be configured to provide at least 3, 3.5, 4, 4.5, 5, 5.5, 6, or more hours of light through an array of light sources. In some embodiments, the array of light sources may comprise at least 6, 7, 8, 9, 10 or more light-emitting diodes (LEDs). In some embodiments, solar light 100 may comprise a third light setting (e.g., "torch" setting) configured to provide a high-power light (e.g., around 150 lumens) through one light source (e.g., LED). In some embodiments, solar light 100 may be configured to provide at least 3, 3.5, 4, 4.5, 5, 5.5, 6, or more hours of light through the single high-power LED.

In some embodiments, solar light 100 may comprise one or more electrical ports, such as charging ports 104, configured to provide power (e.g., charge) to a personal device of the user. For example, a user may plug a charging cable (e.g., a universal serial bus (USB) cable, such as USB-A, USB-B, USB-C, etc.) into a charging port (e.g., USB port) on solar light 100 to charge their personal device (e.g., mobile device, smartwatch, tablet, etc.) using the energy stored in the solar light apparatus (e.g., via a rechargeable battery within the solar light). In some embodiments, solar light 100 may comprise one, two, three, or more charging ports 104. In some embodiments, the charging ports 104 may provide less than or equal to 5 V, 9 V, 15 V, or 20 V of electricity to a mobile device being charged. In some embodiments, the charging ports 104 may provide greater than or equal to 5 V, 9 V, 15 V, or 20 V of electricity to a mobile device being charged.

In some embodiments, the one or more electrical ports of solar light 100 may comprise an electrical port 106 configured to transfer electricity generated from solar panel 140 to solar light 100 via an electrical connector 180. In some embodiments, electrical port 106 may be a direct current (DC) port (e.g., a 5.5 V DC barrel jack). Electrical port 106 may be configured to removably connect to an end of a corresponding electrical connector 180, wherein the opposing end of electrical connector 180 may be configured to connect to solar panel 140. In some embodiments, the port on solar panel 140 for receiving electrical connector 180 may be a DC port (e.g., a 5.5 V DC barrel jack). In some embodiments, one or more ports on solar panel 140 and/or solar light 100 configured to correspond with electrical connector 180 may be a USB port. In some embodiments, one or more of the electrical ports may be plugged with a cap when not in use. For example, solar light 100 may comprise an electrical port cover comprising one or more caps configured to be inserted into the electrical ports 104 and/or 106 when the ports are not connected to a cable.

In some embodiments, solar light 100 may comprise a rechargeable battery configured to store energy (e.g., electricity) transferred to solar light 100 from solar panel 140 (e.g., via electrical connector cable 180). In some embodiments, the rechargeable battery may be a lithium-ion, lead-acid, nickel-cadmium, or nickel-metal hydride battery. For example, the rechargeable battery may be a 3000 mAh, 3.7 V lithium-ion battery. In some embodiments, solar light 100 may comprise more than one battery. In some embodiments, the battery may be electrically coupled to circuitry configured to provide additional features associated with the battery. For example, solar light 100 may be configured to provide an indication when the battery is charging, when the battery level is satisfactory (e.g., over 50%, 75%, 90%, etc. charged), and/or when the battery charge level is low. For example, the indicator may be comprised in one or more light sources (e.g., LEDs) of solar light 100, such that the indicator may illuminate in a different color (e.g., red, green, etc.) and/or flash to provide a battery status. In some embodiments, the circuitry coupled to the battery of solar light 100 may be configured to automatically shut down the device, for example, if a threshold battery level (e.g., 1%, 2%, 5%, 10%, etc.) is breached. In some embodiments, the circuitry may provide overcharge and/or over-discharge protection. In some embodiments, the rechargeable battery may be configured to store at least 6 months of standby battery charge.

The solar light kit described herein may additionally comprise a solar panel 140. Solar panel 140 may be a thin-film (e.g., silicon amorphous), polycrystalline, or monocrystalline solar panel. For example, solar panel 140 may be a polycrystalline panel comprising a plurality of solar (e.g., photovoltaic (PV)) cells. In some embodiments, solar panel 140 may have a wattage rating of at least 5 W (e.g., 5.5 W). In some embodiments, solar panel 140 may be configured to provide a full solar charge to solar light 100 in less than 8 hours. For example, solar panel 140 may provide a full solar charge in 3, 4, 5, 6, 7, or 8 hours. The electrical cable described above and configured to removably connect solar panel 140 and solar light 100 may be selected such that the solar panel may be placed a distance away from the solar light when charging the light (e.g., the solar panel may be disposed outdoors, on a rooftop, etc.). For example, the electrical cable 180 may be at least 1 m, 1.5 m, 2 m, 2.5 m, 3 m or more in length to allow the panel and light to be stored in different environments (e.g., the panel may be placed outdoors, wherein the light may be stored indoors).

In some embodiments, solar panel 140 may comprise a solar panel stand 142. In some embodiments, solar panel stand 142 may be lockable, such that the solar panel 140 may be stood and operably locked at various angles as customized by the user. For example, as will be described in greater detail below at least with respect to FIGS. 4A-4H, the solar panel assembly may comprise stand connectors configured to removably lock solar panel stand 142 with solar panel 140. In some embodiments, the stand 142 may be folded such that it lies flat against the panel 140. In some embodiments, solar panel 140 may be hung from solar panel stand 142 (e.g., from a window, door frame, etc.).

In some embodiments, solar panel 140 and/or solar light 100 may comprise one or more hanging features. For example, one or more corners and/or sides of solar panel 140 may comprise hooks configured to hang solar panel 140, as described above with respect to stand 142. In some embodiments, one or more corners and/or sides of solar panel 140 may comprise through-holes configured to receive a hook such that the apparatus may be hung by inserting a hook through the hole(s). Likewise, solar light 100 may comprise one or more hooks and/or through-holes configured to receive hooks. For example, one or more ends of the solar light 100 may comprise hanging features. Thus, each of solar light 100 may be hung, for example, from a door frame, post, ceiling, etc. to illuminate an area, such as a room of a household. In some embodiments, solar panel 140 may be removably attached to a roof, post, or other object, for example, using removable fasteners and/or hooks inserted into the one or more through-holes on solar panel 140.

Figure 2A:
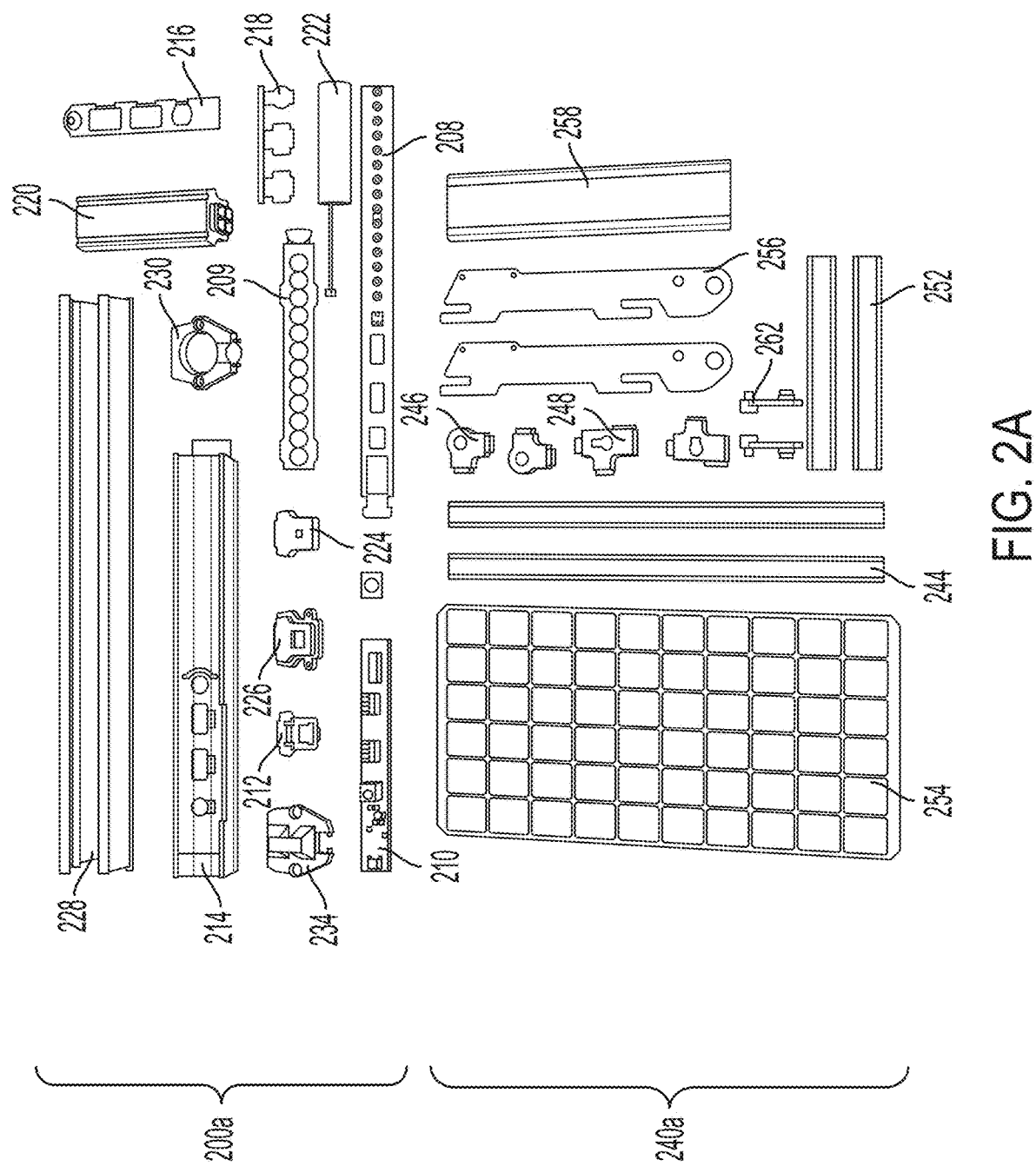
FIGS. 2A-2D show components of a solar light kit package, in accordance with some embodiments.

In some embodiments, solar panel 140 and/or solar light 100 may comprise one or more features configured to organize/maintain at least a portion of electrical connector 180 when connected to the one or more components. For example, solar panel 140 may comprise one or more slots configured to receive the cable of electrical connector 180 (e.g., at one or more corners and/or sides of solar panel 140) for cable management. In some embodiments, the slots may be disposed on one or more arms of the solar panel stand (as illustrated at least in FIG. 2A).

In some embodiments, each of the solar light 100 and solar panel 140 may be lightweight such that the device is portable for the intended user (e.g., children). For example, each of the solar light panel 140 and/or solar light 100 may weigh less than or equal to 1.5 kg, such as 1.4 kg, 1.3 kg, 1.2 kg, 1.1 kg, or less than 1.0 kg. In some embodiments, each of the solar light panel 140 and/or solar light 100 may weigh greater than 1.5 kg, such as 1.6 kg, 1.7 kg, 1.8 kg, 1.9 kg, or greater than 2.0 kg.

In some embodiments, the length of solar panel 140 may be less than or equal to 30 cm, 32 cm, 34 cm, 36 cm, 38 cm, or 40 cm. In some embodiments, the length of solar panel 140 may be greater than or equal to 30 cm, 32 cm, 34 cm, 36 cm, 38 cm, or 40 cm.

In some embodiments, the width of solar panel 140 may be less than or equal to 14 cm, 16 cm, 18 cm, 20 cm, 22 cm, or 24 cm. In some embodiments, the width of solar panel 140 may be greater than or equal to 14 cm, 16 cm, 18 cm, 20 cm, 22 cm, or 24 cm.

In some embodiments, the thickness (e.g., depth) of solar panel 140 may be less than or equal to 2 cm, 2.5 cm, 3 cm, 3.5 cm, 4 cm, 4.5 cm, or 5 cm. In some embodiments, the thickness (e.g., depth) of solar panel 140 may be greater than or equal to 2 cm, 2.5 cm, 3 cm, 3.5 cm, 4 cm, 4.5 cm, or 5 cm.

In some embodiments, the length of solar light 100 may be less than or equal to 32 cm, 34 cm, 36 cm, 38 cm, 40 cm, 42 cm, or 44 cm. In some embodiments, the length of solar light 100 may be greater than or equal to 32 cm, 34 cm, 36 cm, 38 cm, 40 cm, 42 cm, or 44 cm.

In some embodiments, a first and/or second width of solar light 100 may be defined as the dimensions perpendicular to a longitudinal axis of solar light 100. The solar light 100 may be sized such that it may be handheld and portable for the intended user (e.g., children). In some embodiments, the first and/or second width of solar light 100 may be less than or equal to 2 cm, 2.5 cm, 3 cm, 3.5 cm, 4 cm, 4.5 cm, or 5 cm. In some embodiments, the width of solar light 100 may be greater than or equal to 2 cm, 2.5 cm, 3 cm, 3.5 cm, 4 cm, 4.5 cm, or 5 cm.

As mentioned above, solar panel 140 may be configured to be installed on a roof (e.g., a roof of a household), such that a removably attached cable 180 may be fed through a nearby window, rafter, or other opening to charge solar light 100 (e.g., wherein the solar light is stored indoors). In some embodiments, solar light 100 may be usable in extended outdoor travel in adverse weather. Thus, each of solar panel 140 and/or solar light 100 may be manufactured from durable, weather-resistant materials.

For example, one or more components of solar light 100 and/or solar panel 140 may be manufactured from aluminum and/or an aluminum alloy. Aluminum may be selected at least because it is lightweight yet strong, recyclable, and durable. For example, the solar panel frame and/or solar light frame may comprise aluminum (and/or an aluminum alloy). In some embodiments, one or more additional components of solar light 100 and/or solar panel 140 may be manufactured from a long-lasting, durable polymer (e.g., an elastomer). For example, one or more components may comprise polycarbonate, acrylonitrile butadiene styrene (ABS), 30% glass fiber reinforced polyamide, and/or silicone. For example, one or more corner members configured to connect edge members of solar panel 140 (wherein the corner and edge members may be assembled to create the frame of solar panel 140) may be manufactured from a polymer (e.g., 30% glass fiber reinforced polyamide). In some embodiments, one or more components of the solar light kit may be manufactured using injection molding, at least because injection molding techniques may allow for unique, customized geometries of the components.

Characteristics of a Solar Light Kit Package

FIGS. 2A-2D show components of a solar light kit package, in accordance with some embodiments. For example, FIG. 2A may illustrate unassembled components of a solar light device (200a) and a solar panel device (240a). Each of the components used to construct the solar light 200a and solar panel device 240a will be described in greater detail below with respect to FIGS. 3A-3P and 4A-4H, respectively. In some embodiments, components for building solar light 200a may comprise one or more printed circuit boards (PCBs) (208, 210), a plurality of end caps (212, 224, 226, 230, 234), a PCB storage component 214, a casing 228, an electrical port plate 216, an electrical port cover 218, and one or more battery storage components (220, 222). In some embodiments, PCB 208 may be configured to attach to (and/or may comprise) a lens 209 for dispersing light from one or more light sources (e.g., LEDs). In some embodiments, PCB 210 may comprise one or more electrical ports for providing charge to an additional device (e.g., a mobile device) and/or transferring electricity generated by the constructed solar panel to the constructed solar light device.

In some embodiments, components for building solar panel device 240a may comprise a solar panel 254, one or more edge members (244, 252), one or more corner members (246, 248), one or more stand components (256, 258), and one or more stand connectors 262. The solar light kit may comprise a plurality of removable fasteners (e.g., screws, nuts, bolts, etc.) for assembling the solar light panel and/or solar light device (not illustrated). For example, as will be described in greater detail below, the solar light kit may comprise a plurality of different-sized screws configured to be fastened with a limited number of wrenches (e.g., Allen keys).

Figure 2C:
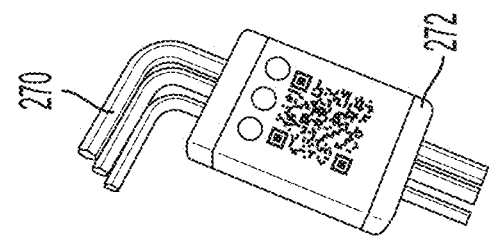
Figure 2B:
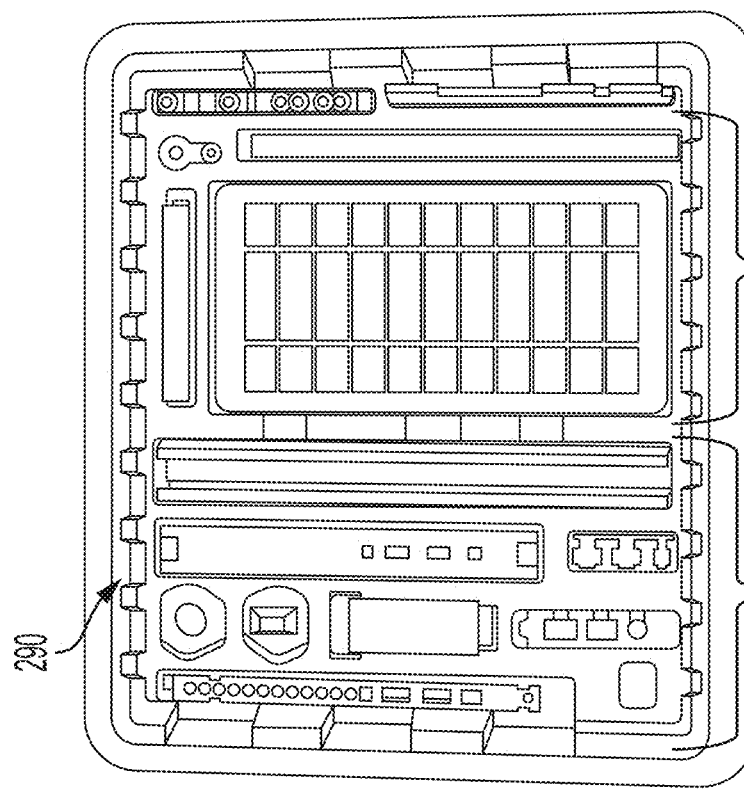

FIG. 2B illustrates packaged components of a solar light kit comprising solar light components 200b and solar light panel components 240b. As shown, each of the components for assembling the solar light may be packaged together in a manner such that each component has a defined storage space (e.g., pocket, envelope) in the packing tray 290. The pockets in packing tray 290 may be configured to contain each of the components in a specified orientation, allowing for each component to be visible to the builder. For example, a pocket in the packing tray 290 may be configured to contain each of the arms used in assembling the stand of solar panel 240b, such that arms may be stacked in packing tray 290 in a shared pocket. Likewise, edge members of the same dimensions may be stacked in a shared pocket of packing tray 290.

Figure 2D:
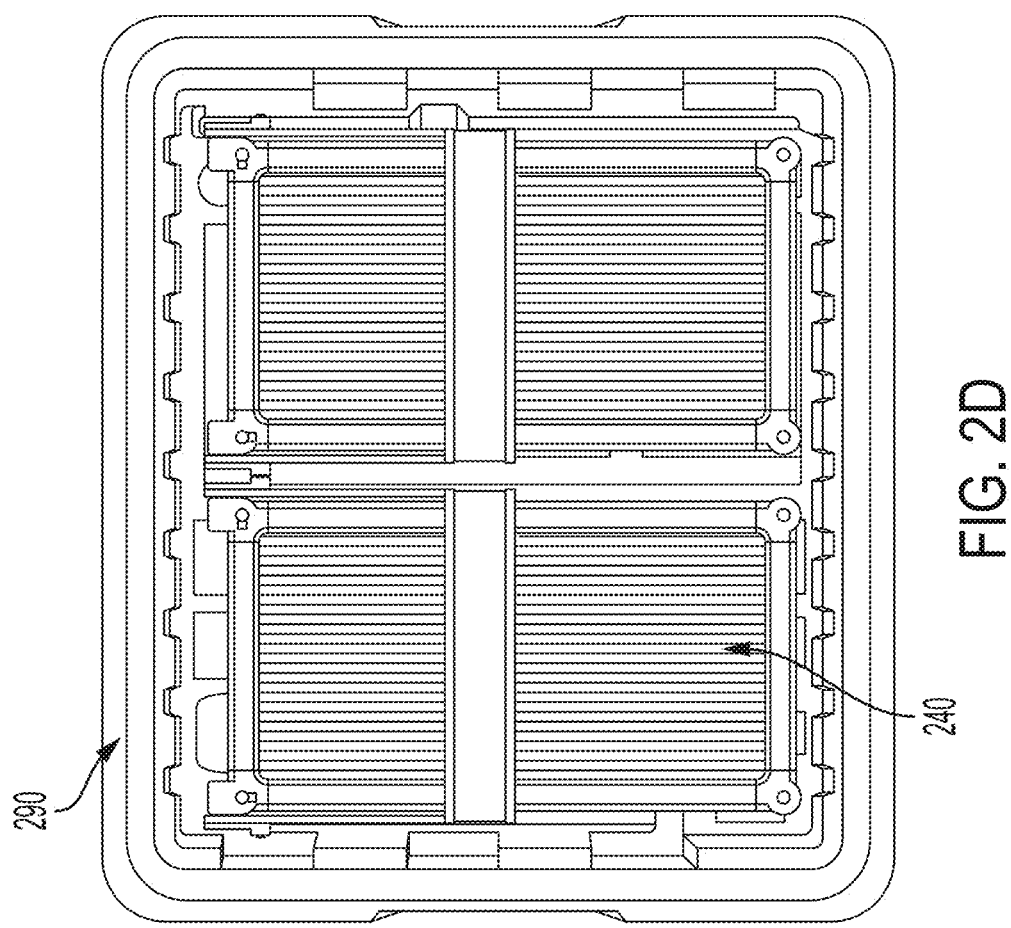

In some embodiments, packing tray 290 may be constructed from recycled materials, such as recycled paper pulp, and may additionally be compostable after use. In some embodiments, packing tray 290 may be configured to store unassembled solar light kits (as shown in FIG. 2B) as well as assembled solar light kits, as shown in FIG. 2D. In some embodiments, packing tray 290 may be stackable such that a plurality of trays may be stacked for transporting the kits. For example, packing tray 290 may comprise tapered side walls, wherein one or more of the side walls of the packing tray may comprise built-in handles. The tapered side walls and/or handles may aid not only in stacking trays, but also separating one or more trays from a stack of trays. Thus, unassembled kits may be easily shipped to the builder (e.g., children in schools), and once constructed, the assembled solar lights may be returned to the packing tray for eventual shipment to the intended end user (e.g., children and/or families in developing communities). The packing trays may be reused, or as mentioned above, recycled and/or composted.

FIG. 2C illustrates a toolkit for assembling a solar light kit, according to some embodiments. For example, the toolkit 270 may comprise one or more handheld tools for tightening and/or loosening one or more fasteners in the solar light kit. In some embodiments, the one or more handheld tools may be sized for use by the intended builder (e.g., children). In some embodiments, toolkit 270 may comprise one or more wrenches, such as a hexagon (e.g., Allen key) wrench, open-ended wrench, and/or ratchet wrench. In some embodiments, toolkit 270 may comprise one or more screwdrivers, such as a flat head, Phillips, and/or hexagon screwdriver. In some embodiments, as shown in FIG. 2C, toolkit 270 may comprise a variety of handheld tools (e.g., wrenches), wherein each wrench in the toolkit is configured to correspond with a different size of fastener (e.g., screw). Each of the handheld tools may be bundled, for example, using a tool holder 272. In some embodiments, the tool holder 272 may be manufactured from a biodegradable material, such as polylactic acid (PLA), for example using 3D-printing manufacturing techniques.

In some embodiments, a sticker comprising a scannable barcode (e.g., QR code) may be attached to tool holder 272, such that the builder may scan the barcode to receive building instructions for the solar light kit, educational materials regarding the program associated with the solar light kit, etc. In some embodiments, tool holder 272 may comprise one or more markings for differentiating between each of the tools in toolkit 270. For example, the position of the handheld tools as bundled by the tool holder 272 may correspond with one or more markings on tool holder 272, and the one or more markings may be referenced throughout the building instructions. With the use of the toolkit and removable fasteners, the solar light kit (e.g., solar panel device and solar light device) may be assembled using a limited number of handheld tools and fasteners and may easily be disassembled in the instance one or more components of the devices requires replacement and/or fixing. Additionally, the solar light kit may not require any adhesives (e.g., glue, tape, etc.), power tools, or soldering to successfully assemble the solar light kit.

In some embodiments, one or more toolkits 270 and fasteners for assembling a solar light kit may be provided in a pouch, such that a group of users (e.g., a class of students)

may be provided multiple toolkits and sets of fasteners in a single pouch. In some embodiments, the pouch may be fabricated from recycled materials.

Assembly of a Solar Light Device

Figure 3A:
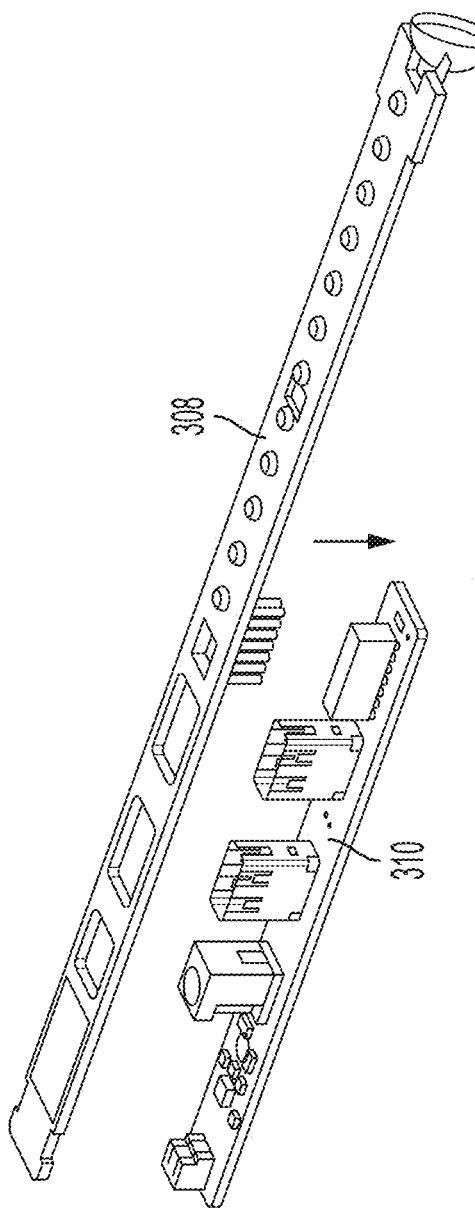
FIGS. 3A-3P show assembly steps of a solar light of the solar light kit, in accordance with some embodiments.
Figure 3B:
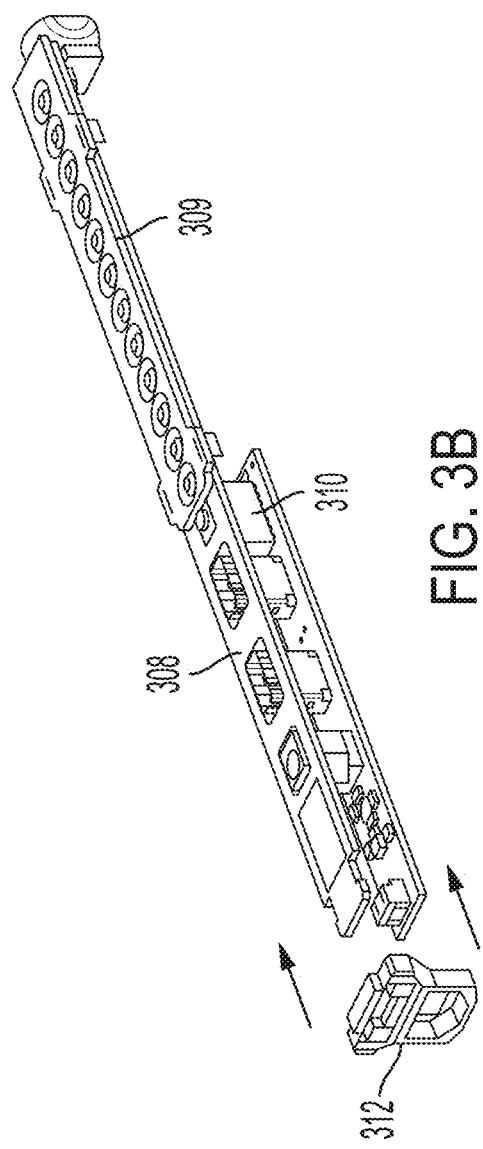
Figure 3E:
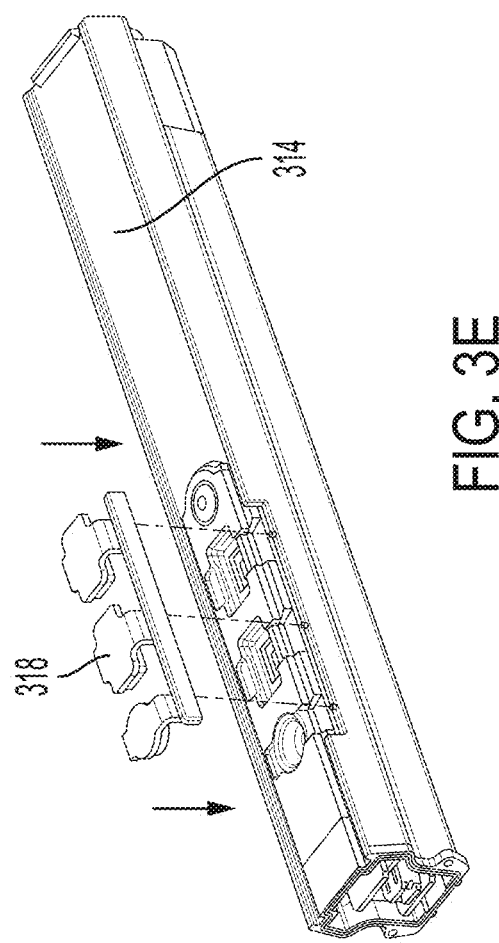
Figure 3F:
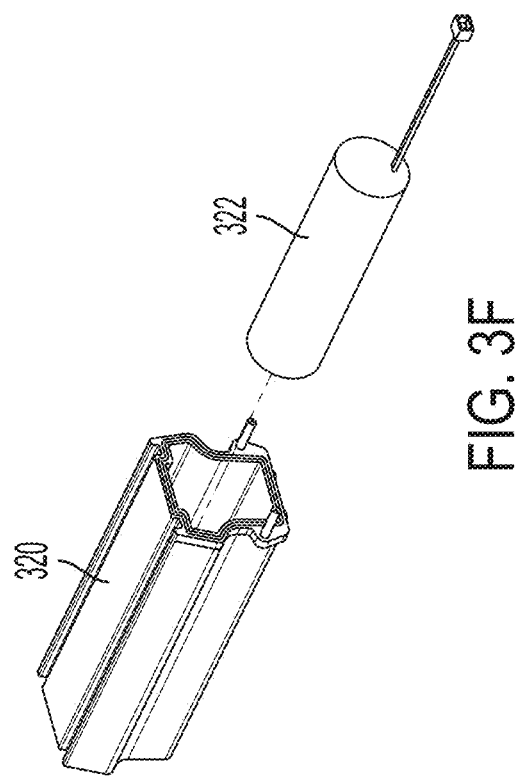
Figure 3H:
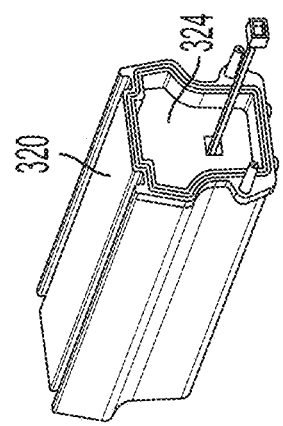
Figure 3J:
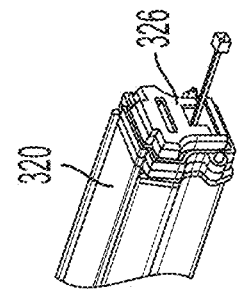
Figure 3G:
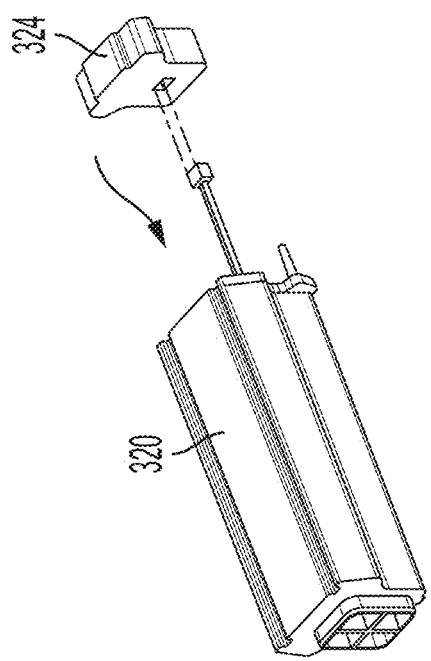
Figure 3I:
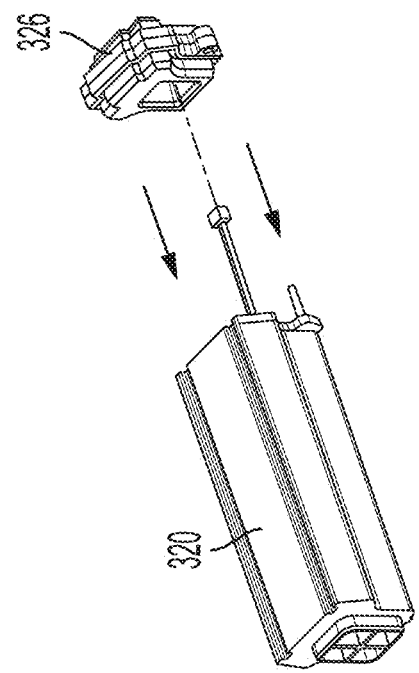
Figure 3L:
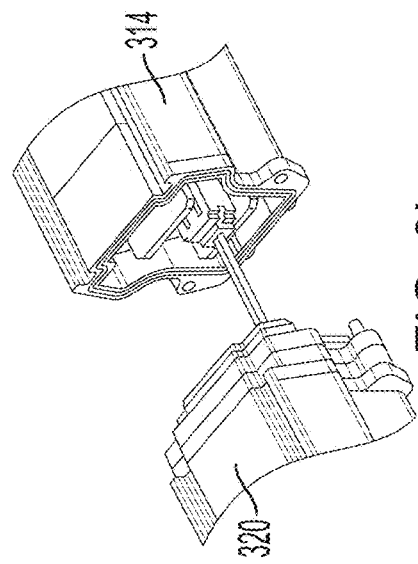
Figure 3N:
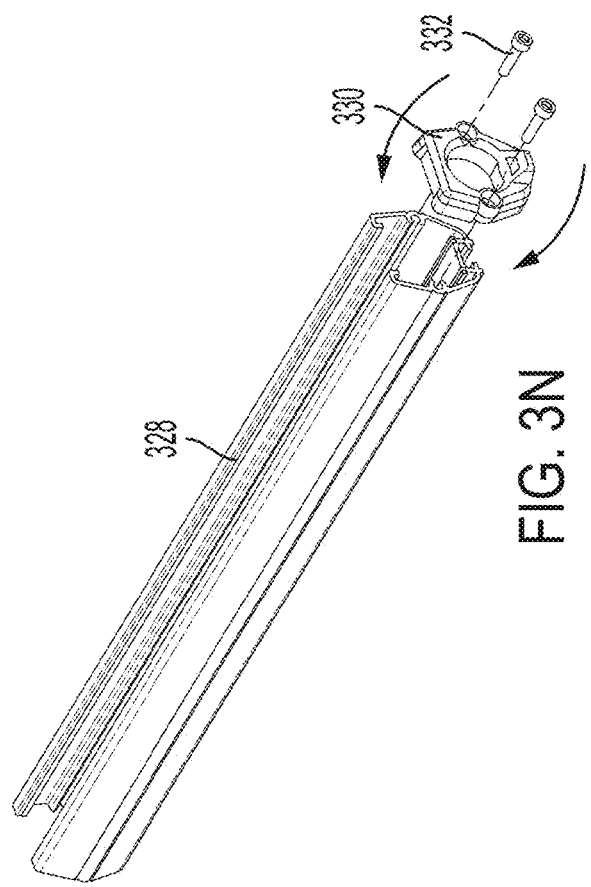
Figure 3K:
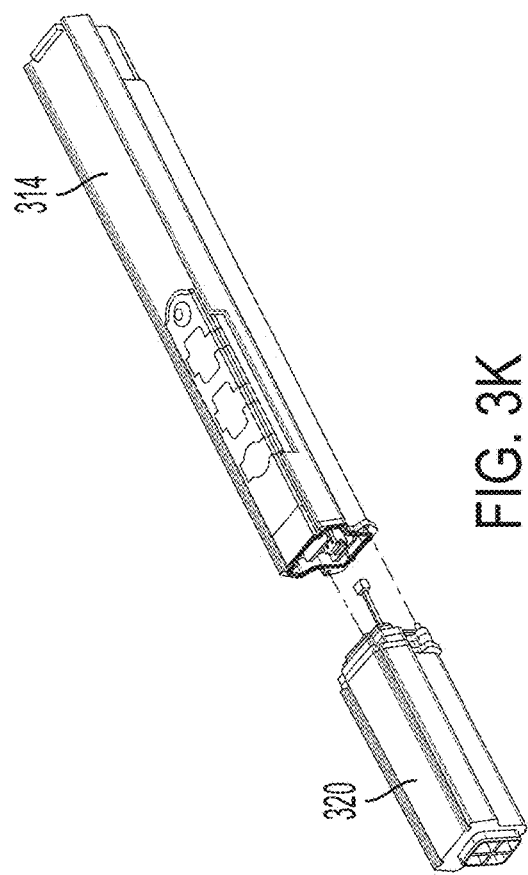
Figure 3M:
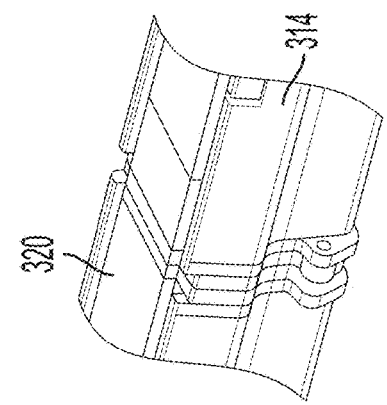
Figure 3O:
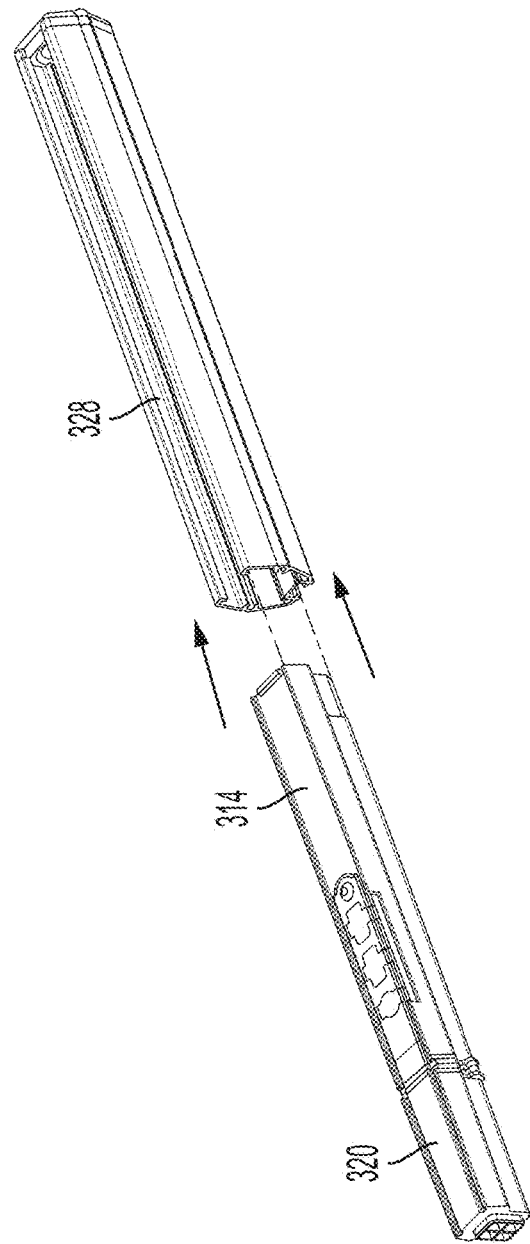
Figure 3P:
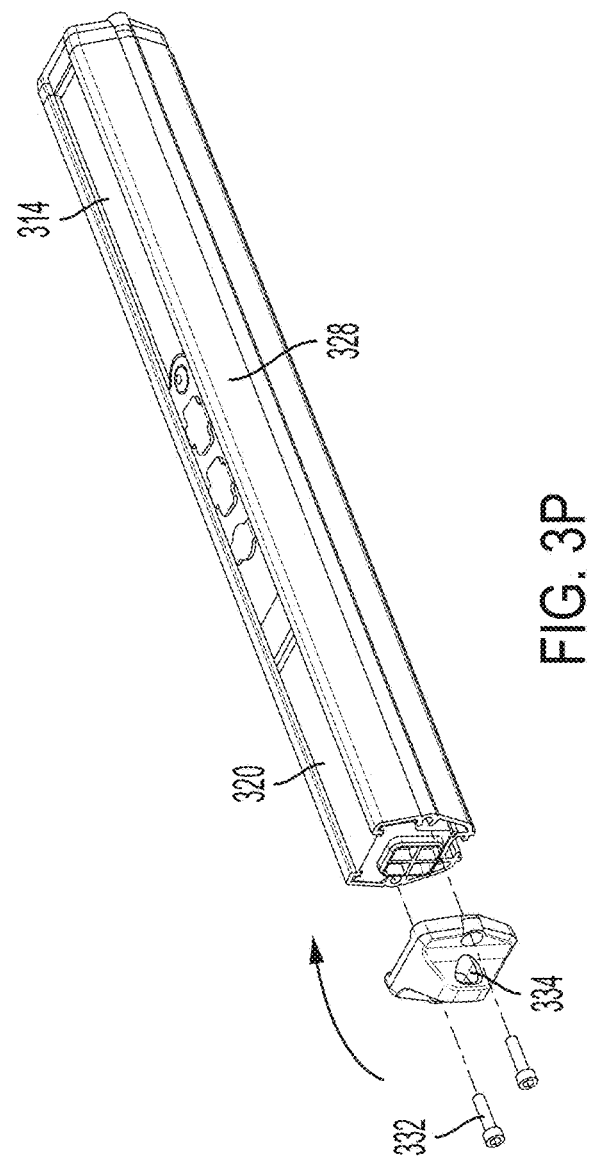

FIGS. 3A-3P show assembly steps of a solar light device of the solar light kit, in accordance with some embodiments. In some embodiments, each of the components for assembling the solar light from the solar light kit may be assembled in a particular fashion such that each part may fit together in a limited number of (e.g., one) orientation(s). In some embodiments, assembling the solar light may require at least a portion of the steps described with respect to FIGS. 3A-3P to be followed sequentially such that a later described step may not be completed before an earlier described step. In some embodiments, each of the components of the kit may be removably attachable such that each of the steps described below may be completed in a reverse order to disassemble the solar light device.

As illustrated in FIG. 3A, a user (e.g., builder) may begin to assemble the solar light by first connecting a first printed circuit board (PCB) 308 and a second PCB 310. For example, the PCBs 308, 310 may be attached by aligning corresponding portions of the PCBs and applying pressure between the components. In some embodiments, PCB 308 and/or PCB 310 may comprise one or more receiving portions and one or more inserting portions. For example, PCB 308 may comprise a set of leads (e.g., inserting portions) configured to be inserted into a port (e.g., receiving portion) on PCB 310. For example, the port may be a communication port configured to receive the leads on PCB 308 in a press-fit manner. In some embodiments, PCB 308 may comprise one or more through-holes configured to receive one or more elevated portions (e.g., ports) on PCB 310 (e.g., in a slip-fit). Thus, in attaching PCB 308 and 310, the user may be required to align each of the components configured to match on the PCBs to successfully attach the PCBs. In some embodiments, rather than comprising multiple PCBs, wherein each PCB comprises a portion of the modules required to operate the solar light, the solar light kit may comprise a single PCB comprising all the electrical modules, and thus a connection step may not be required. In some embodiments, the solar light kit may comprise a plurality of PCBs, and the modules for operating the device may be disposed in a different manner from that which is described above.

As mentioned above, one or more ports on PCB 310 may be charging ports for external devices. In some embodiments, a port of the one or more electrical ports on PCB 310 may be configured to receive an electrical connector (e.g., cable) for connecting the assembled solar light to the assembled solar panel (e.g., to transfer charge generated from the solar panel to the light). In some embodiments, PCB 308 may comprise an array of light sources (e.g., light emitting diodes, LEDs). In some embodiments, PCB 308 may comprise a lens configured to disperse light from the array of LEDs. In some embodiments, the user may be required to attach a lens 309 packaged individually from PCB 308 to the PCB (e.g., as illustrated in FIG. 3B), such that the lens 309 may cover the array. In some embodiments, lens 309 may click (e.g., snap) onto a portion of PCB 308 such that the lens may only be attachable to PCB 308 on a particular side of and in a specific orientation on the PCB.

PCBs 308, 310 may be shaped such that they are insertable into and extend along a housing of the torch-style solar light. For example, the PCBs may be elongated strip-shaped members comprising a substantially flat top and bottom face with one or more modules (e.g., ports, leads, etc.) configured thereon. For example, each of the receiving and inserting portions described above may be disposed on the top and/or bottom face of PCBs 308, 310. In some embodiments, a first end of PCB 308 may comprise an LED array, and a second end of PCB 308 may comprise one or more through-holes configured to receive the extruded ports on PCB 310. In some embodiments, PCB 310 may be about half the length of PCB 308, such that PCB 310 extends the length of PCB 308 comprising the one or more through-holes and ends approximately when the LED array begins on PCB 308.

Following connecting the PCBs 308, 310, the builder may attach an end cap (e.g., bracket) 312 to the end of the connected PCBs. As shown in FIG. 3B, bracket 312 may comprise one or more openings configured to receive a portion of PCB 308 and PCB 310 and may be configured to surround at least a portion of the connected PCBs. Due at least to the customized geometry of one or more of the PCBs and/or one or more modules on the PCB, the bracket 312 may comprise a customized configuration that may be attachable in a single orientation to the PCBs. In some embodiments, bracket 312 may be attached to the connected PCBs by applying pressure between the bracket 312 and connected PCBs 308, 310. In some embodiments, bracket 312 may click (or snap) into place on a portion of the connected PCBs.

FIG. 3C illustrates a subsequent step of the method of assembling the solar light. As mentioned above, the solar light may comprise one or more housings, such as PCB housing 314. In some embodiments, prior to inserting the connected PCBs into PCB housing 314 (as illustrated in FIG. 3D), an electrical port plate 216 may be attached to PCB housing 314. In some embodiments, electrical port plate 216 may be attached after inserting the connected PCBs 308, 310 into PCB housing 314. In determining the orientation with which to attach electrical port plate 316 to PCB housing 314, the plate may comprise one or more through-holes configured to align with one or more through-holes on PCB housing 314. Each of the aforementioned sets of through-holes on PCB housing 314 and electrical port plate 316 may be configured to align with and receive one or more raised (e.g., extruded) electrical ports on the connected PCBs (e.g., on PCB 310). In some embodiments, PCB housing 314 may comprise a receded portion configured to correspond with and receive the electrical port plate 316. In some embodiments, electrical port plate 316 may snap to one or more features on PCB housing 314 (e.g., by applying pressure between electrical port plate 316 and PCB housing 314). In some embodiments, electrical port plate 316 may comprise a clickable button (e.g., button 102 described above with respect to FIG. 1) configured to align with and activate/deactivate a switch on the connected PCBs. Thus, electrical port plate 316 may be configured to connect to PCB housing 314 in a specific orientation such that each of the button and/or through-holes/ports may be in proper alignment.

As mentioned above, the connected PCBs may be inserted into PCB housing 314. In some embodiments, PCB housing 314 may comprise an open end and a closed end. The connected PCBs 308, 310 may be inserted into PCB housing 314 such that a first end of the connected PCBs (e.g., the end opposite from bracket 312) is guided into the open end of the housing. In determining the correct orientation with which to insert the connected PCBs into PCB housing 314, the builder may orient the face of the connected PCBs comprising the receiving end of the electrical ports in the direction facing the port openings (e.g., through-holes) on PCB housing 314. In some embodiments, bracket 312 may be designed such that a top portion of the bracket is larger than a bottom portion, which may correspond with the perimeter of PCB housing 314. Thus, the connected PCBs with bracket 312 may only fit into PCB housing 314 in a particular orientation.

Once electrical port plate 316 is attached to PCB housing 314 and the connected PCBs 308, 310 are inserted into the housing, the builder may attach an electrical port cover 318 to the partially assembled device. Electrical port cover 318 may comprise a strip portion with one or more caps extending away from the strip and configured to cover the electrical ports on PCB 310 (e.g., through one or more openings mentioned above). For example, the strip portion of electrical port cover 318 may snap into a corresponding receded portion on a side of PCB housing 314 (e.g., by applying pressure between the strip portion and PCB housing 314). Each of the one or more caps on electrical port cover 318 may be configured to be removably inserted into the one or more ports when the ports are not in use. In some embodiments, at least a portion of electrical port cover 318 (e.g., the individual caps) may comprise a deformable, bendable polymer (e.g., elastomer) such that the user of the solar light may easily toggle the electrical port cover 318 from a state in which one or more of the individual caps are inserted into the ports and removed from the ports. In some embodiments, electrical port cover 318 may comprise a first color (e.g., red, blue, yellow, green, black, white, etc.), and electrical port plate 316 may comprise a second color different from the first, such that the user may easily determine the location of ports on the device.

In some embodiments, each of the individual caps may comprise a marking, for example, denoting the use of the port. For example, the one or more caps configured to cover a port for charging an external device may comprise a marking stating "out," wherein power from the solar light device is transferred out of the device to charge other devices. Likewise, one or more caps configured to cover an electrical port for transferring electricity from the solar panel may comprise a marking stating "in," wherein power may be transferred into the solar light to charge the solar light (e.g., from the solar panel). In some embodiments, the type of electrical connector (e.g., cable) configured to be inserted into each of the ports described above may be different. For example, the one or more ports for transferring electricity into the solar light may be a first type of port (e.g., DC barrel jack input, as mentioned above) and the one or more ports for charging other devices may be a second type of port (e.g., USB port, as mentioned above).

The solar light device described herein may comprise at least one, and in some embodiments, at least two main bodies. For example, the first main body may be the PCB housing 314 described above, wherein the PCB housing may enclose the one or more PCBs and may comprise one or more removable components (e.g., electrical port plate 316 and/or electrical port cover 318) attached thereon. A second main body of the solar light device may be a battery housing 320, as will be described with respect to FIGS. 3F-3J below. In some embodiments the PCB housing 314 and battery housing 320 described herein may be encompassed in a single housing.

As shown in FIG. 3F, a battery 322 may be inserted into battery housing 320. In some embodiments, a first end of battery 322 may be attached to a wire (e.g., lead) extending from the battery. In some embodiments, battery housing 320 may comprise an open end and a closed end. Thus, battery 322 may be inserted into battery housing 320 by introducing the end of battery 322 into the housing first, such that the end without the wire aligns with the closed end of housing 320. In some embodiments, battery housing 320 may be an elongated member configured to completely cover (e.g., house) battery 322. Thus, the user may ensure in inserting the battery into the housing that the battery is fully inserted (e.g., completely covered) by the housing 320.

In the assembly step illustrated in FIG. 3G, a battery end cap 324 may be configured to be inserted into battery housing 320, for example, by applying pressure to the end cap 324 as it is inserted into the housing, at least to ensure that battery 322 is secured within the housing. In some embodiments, battery end cap 324 may be sized and designed such that the perimeter of the end cap corresponds with the perimeter of housing 320. Thus, the end cap 324 may only be inserted into the housing 320 in a particular orientation, as shown in FIG. 3G. In some embodiments, end cap 324 may comprise a through-hole configured to receive the wire extending from battery 322. Thus, the user may feed the wire into the through-hole when inserting end cap 324 into housing 320. As shown in FIG. 3H, end cap 324 may be fully inserted into housing 320 such that a portion of the end of the housing extends beyond the thickness of end cap 324.

Following insertion of end cap 324, a second end cap 326 (e.g., a battery housing end cap) may be attached to (e.g., at least partially inserted into) housing 320. It is important that prior to inserting end cap 326, end cap 324 may be fully inserted into housing 320 to secure battery 322. In some embodiments, the perimeter of end cap 326 may be designed and sized such that a first portion of the battery housing end cap 326 may be received by housing 320 until a lip on end cap 326 is reached. For example, the builder may apply pressure to snap the end cap 326 into housing 320 until the lip on end cap 324 is reached. In some embodiments, the lip on end cap 326 may be substantially the same dimensions as the perimeter of battery housing 320. In some embodiments, the end cap lip may only extend a portion of the thickness of end cap 326, such that a first side of end cap 326 may be inserted into battery housing 320, as described above, and a second side of end cap 326 may be configured to receive an end of the PCB housing, as will be described in greater detail below with respect to FIGS. 3K-3M. Battery housing end cap 326 may comprise at least one through-hole (e.g., opening), such that a wire extending from battery 322 and through end cap 324 may also extend through end cap 326 (e.g., as shown in FIG. 3J). In some embodiments, the first side of end cap 326 configured to be inserted into battery housing 320 may comprise a single opening encompassing the through-hole, wherein the second side of end cap 326 facing outwards from battery housing 320 may comprise more than one opening, with at least one of the openings encompassing the through-hole.

Following sequential insertion of the battery 322, end cap 324, and end cap 326 to battery housing 320, the partially assembled components of the solar light device may be connected (e.g., illustrated in FIG. 3K). Prior to connecting battery housing 320 and PCB housing 314, the builder may connect the battery wire (e.g., lead) extending from within battery housing 320 to the one or more PCBs (e.g., PCB 310). For example, a portion of PCB 310 configured to receive the battery wire may be located proximate to the open end of PCB housing 314, such that the user may easily connect the wire to the PCB, as shown in FIG. 3L. In some embodiments, the housing (e.g., battery housing 320 and/or PCB housing 314) may comprise a receiving portion configured to connect to the battery lead. Once the battery is connected to the PCB, the builder may connect PCB housing 314 (and all components attached to and/or inserted therein)

to battery housing 320 (and all components attached to and/or inserted therein). For example, the builder may apply pressure to removably connect PCB housing 314 and battery housing 320, wherein the attached components are illustrated in FIG. 3M.

In some embodiments, the end of battery housing 320 comprising end cap 326 may be configured to be connected to the open end of PCB housing 314 (e.g., the end comprising bracket 312). In some embodiments, as mentioned above, battery housing end cap 326 may be sized and designed such that the end cap may be inserted into PCB housing 314. For example, battery housing end cap 326 may comprise at least one opening on the face of the end cap facing outward from battery housing 320. The at least one opening may be configured to receive one or more components 314 (e.g., the end of one or more PCBs) extending toward the open end of PCB housing. Thus, the components housed within PCB housing 314 may be secured in place when end cap 326 attached to battery housing 320 is connected to PCB housing 314.

The solar light kit described herein may comprise one or more casings configured to protect one or more components of the kit. For example, as shown in FIG. 3N, the solar light it may comprise an elongated casing 328 comprising an opening that extends along the casing, wherein the casing is configured to extend along at least two sides of the connected PCB housing 314 and battery housing 320. Prior to inserting the connected components into casing 328, the builder may be required to attach an end cap to the casing 328. For example, as illustrated in FIG. 3N, a casing end cap 330 may be attached to casing 328 using one or more fasteners 332 and a handheld tool (wherein the handheld tool is not illustrated for simplicity). In some embodiments, end cap 330 may comprise at least one through-hole configured to receive the one or more fasteners 332. In some embodiments, an end of casing 328 may additionally comprise one or more sockets configured to align with the through-holes on end cap 330 and receive the one or more fasteners 332. In some embodiments, a first (e.g., upper) portion of end cap 330 may be configured to align with a longitudinal opening on casing 328 (e.g., wherein three of four sides of the casing may be closed), and a second (lower) portion of end cap 330 may be configured to align with the opposite side from the opening on casing 328. Thus, the user may align the end cap 330 with the appropriate sides of casing 328 at the end of the casing, and may attach (e.g., fasten) the one or more fasteners (e.g., screws) into the corresponding receiving portions (e.g., sockets) to secure the end cap to the casing.

In some embodiments, as mentioned above, the solar light kit toolkit may comprise a plurality of fasteners and/or handheld tools. The user instructions (e.g., accessed by scanning a QR code on the tool holder) may indicate to the builder the correct handheld tool, fastener (e.g., screw size), and number of fasteners to successfully complete the assembly step. For example, fastening the end cap 330 to casing 328 may require one or more fasteners (e.g., screws) of a first size/type that may be different from the remaining assembly steps of the solar light kit.

Once the casing end cap is attached to casing 328, the builder may insert the connected housings into the casing, as illustrated in FIG. 3O. For example, the portion (e.g., end) of the connected components comprising the PCB housing may be inserted into the casing 328 such that the end of casing 328 attached to the end cap 326 may be positioned proximate to PCB housing 314, and the remaining open end of casing 328 may be positioned proximate to battery housing 320. In some embodiments, the connected housings may be inserted such that the opening extending the length of casing 328 may be aligned with the face comprising one or more interactive components (e.g., buttons and electrical ports) contained within the housings, thus allowing the interactive components to be accessible to the user. In some embodiments, the casing 328 and housings 314, 320 may be sized such that the connected housings may easily be inserted into the casing to be secured (e.g., a slip-fit, rather than requiring the user to apply pressure to insert the attached components into the casing). In some embodiments, casing 328 may comprise one or more grooves along the length of the inner surface of the casing that may be configured to receive one or more corresponding (e.g., recessed) portions on the connected housings 314, 320.

Upon inserting the connected PCB housing 314 and battery housing 320 into casing 328, the user may secure the housings within the casing to complete the assembly of the solar light device. For example, as described above with respect to end cap 332, the builder may attach an end cap 334 to the casing 328 using a handheld tool and one or more removable fasteners 332. In some embodiments, casing end cap 334 may differ from end cap 332 at least because end cap 334 may comprise one or more openings (e.g., recessed portions) on an inner face of the end cap configured to receive an extruded portion on battery housing 320 extending from the open end of casing 328. In some embodiments, like the end of casing 328 configured to receive end cap 332, the open end of casing 328 illustrated in FIG. 3P may comprise one or more sockets configured to receive one or more fasteners. Likewise, casing end cap 334 may comprise one or more through-holes configured to align with the sockets on casing 332 and receive the one or more fasteners to attach end cap 334 to casing 328 and secure the solar light components within the casing. As mentioned above, in some embodiments the instructions for building the solar light from the kit may inform the user which handheld tool and/or fasteners to use to secure the end cap 334 to casing 328. In some embodiments, the handheld tool and/or fasteners used to install end cap 334 may be the same as those used to install end cap 332 to casing 328. Thus, in some embodiments, assembling the solar light device from the solar light kit may comprise the use of a single handheld tool, and a single type/size of fasteners.

In some embodiments, one or more of the end caps 332, 334 may comprise hooks and/or receiving portions (e.g., holes) for hooks, such that the constructed solar light may be hung by the one or more hooks on the ends of the device. As mentioned above, each of the assembled components described herein may be disassembled, for example, to replace and/or fix one or more components in the device. For example, one or more steps in the process described above with respect to FIGS. 3A-3P may be reversed to disassemble the solar light device.

Assembly of a Solar Panel Device

FIGS. 4A-4H show assembly steps of a solar panel device of the solar light kit, in accordance with some embodiments. In some embodiments, each of the components for assembling the solar panel from the solar light kit may be assembled in a particular fashion such that each part may fit together in a limited number of (e.g., one) orientation(s). In some embodiments, assembling the solar panel may require at least a portion of the steps described with respect to FIGS. 4A-4H to be followed sequentially such that a later described step may not be completed before an earlier described step. In some embodiments, each of the components of the kit may be removably attachable such that each of the steps described below may be completed in a reverse order to disassemble the solar light panel.

Figure 4A:
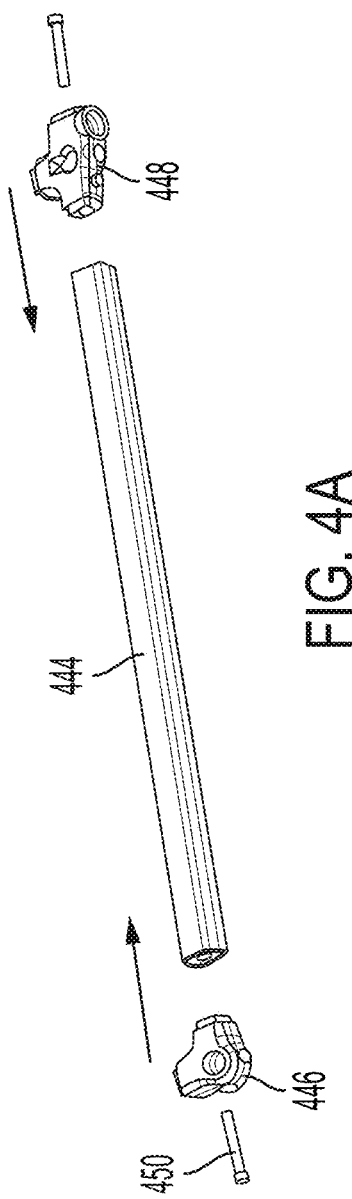

As illustrated in FIGS. 4A-4D, the solar panel may begin to be assembled from the solar light kit components by assembling the frame of the solar panel. In some embodiments, the frame of the solar panel may comprise a plurality of edge members and corner members. As shown in FIG. 4A, corner members 446, 448 may be connected to an edge member 444 using at least one handheld tool and one or more removable fasteners 450. In some embodiments, the frame of the solar panel may comprise different types of corner members, as well as different sizes of edge members to accommodate the size of the solar panel. For example, corner members 446 may comprise two connecting portions configured to connect to the edge members of the solar panel, whereas corner members 448 may comprise the two connecting portions configured to connect to the edge members, as well as an additional connecting portion configured to connect to the stand of the solar panel, as will be described in greater detail below at least with respect to FIGS. 4F-4H.

In some embodiments, the builder may determine the correct orientation of each of the corner members and edge members configured to border the solar panel by laying out each of the components prior to assembling, such that the inner bend (e.g., right-angle) on corner members 446, 448 may be configured to contact the solar panel when the solar panel is inserted into the frame assembly. In some embodiments, the edge members and/or corner members may comprise grooves (e.g., slots) configured to receive the solar panel. For example, the edge members may comprise slots along the longitudinal axis of the member. Thus, the builder may determine the orientation of the edge members with respect to the corner members by aligning the grooves to face inward (e.g., toward the solar panel that will be inserted into the assembly).

The corner members 446, 448 may be connected to the edge member 444 by inserting the appropriate connecting portion on the corner members into a receiving portion on the edge member. For example, a first connecting portion of corner member 446 may be sized such that at least a portion of the corner member may be inserted into a first end of edge member 444. Likewise, a first connecting portion of corner member 448 may be sized such that at least a portion of the corner member may be inserted into a second end of edge member 444. The connections may be secured using at least one handheld tool and one or more removable fasteners 450. For example, each corner member 446, 448 may require a single fastener (e.g., screw) 450 to secure the corner member to the edge member. The corner members 446, 448 and/or edge member 444 may comprise a receiving portion for the screw, wherein the receiving portions comprise one or more threads configured to correspond with those on the screw. For example, the edge member 444 may comprise a socket, and the corner member may comprise a through-hole, wherein at least one of the socket and/or through-hole may comprise threads configured to correspond with those on the fastener (e.g., in the instance the fastener is a screw).

In some embodiments, the handheld tool and/or fasteners for assembling the frame of the solar panel may be different from the handheld tool and fasteners described above for securing the end caps to the casing of the solar light. The instructions for assembling the solar light kit may comprise an indication of which handheld tool from the toolkit and removable fasteners to use in assembling the frame of the solar panel.

Figure 4B:
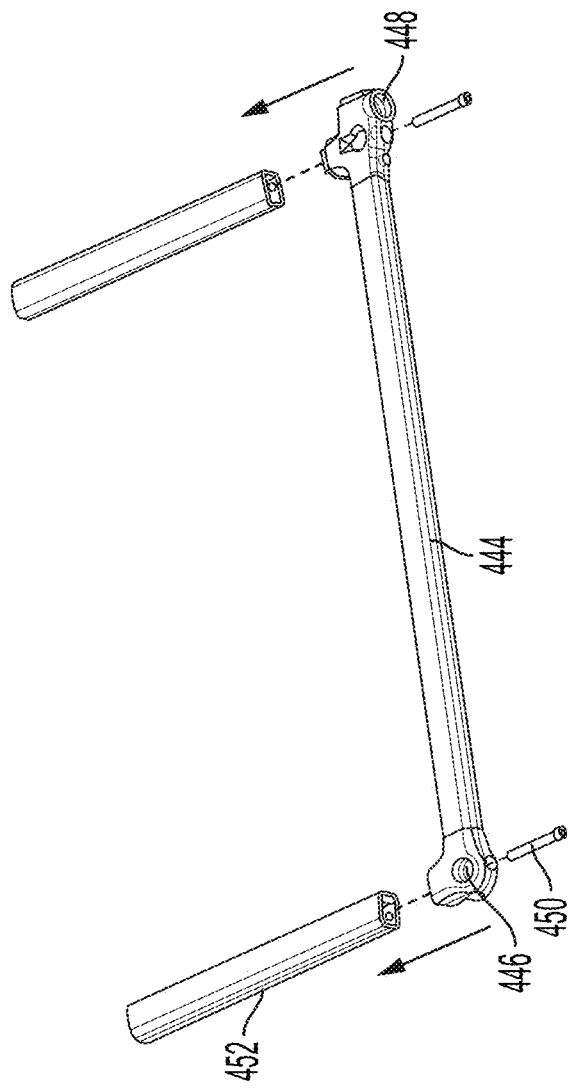

In some embodiments, the builder may repeat the assembly step described above and illustrated in FIG. 4A to assemble another side of the frame for the solar panel, wherein the second side of the frame may be placed opposite from the previously assembled portion (e.g., described above) in the frame assembly. The two assembled sides may be referred to as the long edges of the solar panel, at least because relative to the remaining sides of the frame to be assembled, the edge members may be longer than the edge members of the unassembled sides. As shown in FIG. 4B, a first assembled long edge may be connected to two edge members 452. As mentioned above, in some embodiments, edge members 452 may be a shorter length than edge members 444, at least because the solar panel may be rectangular in shape (e.g., comprise a pair of long sides and a pair of shorter sides). In some embodiments, the solar panel may be square-shaped, thus edge members 444 and 452 may be substantially the same length.

The corner members 446, 448 may be connected to edge members 452 using at least one handheld tool and one or more removable fasteners at each corner. For example, corner members 446, 448 and edge members 452 may comprise receiving portions configured to receive a removable fastener to secure the connection between edge members 452 and corner members 446, 448. For example, the receiving portion in edge members 452 may comprise a socket, whereas the receiving portion in corner members 446, 448 may comprise a through-hole, wherein at least one of the socket and/or through-hole may comprise threads configured to correspond with those on the fastener. In some embodiments, at least a portion of corner members 446, 448 may be sized such that the corner members may be inserted into edge members 452. In some embodiments, edge members 452 may comprise grooves, as described above with respect to edge members 444, such that the grooves are configured to face inwards towards a solar panel. Thus, in connecting edge members 452 to corner members 446, 448, the user may ensure that grooves are oriented in the correct manner prior to connecting edge members 452 to the corner members.

Prior to attaching a partial frame assembly comprising one side of the frame to the remainder of the frame assembly, the user may insert solar panel 454 into the partial frame assembly comprising three sides of the frame assembly, as shown in FIG. 4C. As mentioned above, edge members 444, 452 may comprise grooves (e.g., slots) configured to receive an edge of the solar panel, such that the solar panel may be slid into the grooves.

Once the solar panel is inserted into the 3-sided partial frame assembly, the assembly step of connecting edge members 452 to corner members 446, 448 may be repeated an additional time to enclose the solar panel in the frame (e.g., illustrated in FIG. 4D). For example, the frame assembly portion comprising a single edge member 444 connected to corner members 446, 448 may be connected to the open ends of edge members 452. In some embodiments, the corner members 446, 448 may be connected to the edge members 452 in substantially the same manner as described above with respect to FIG. 4B. For example, the corner members 446, 448 and second end of edge member 452 may comprise receiving portions configured to receive a removable fastener (e.g., a socket and through-hole, at least one of which may comprise corresponding threads). Thus, the user may connect the corner members 446, 448 to the edge members 452 and secure the connection using the removable fasteners 450 and a handheld tool. In some embodiments, the removable fasteners and handheld tool may be the same as those described above with respect to FIG. 4B. The instructions for assembling the solar light panel from the solar light kit may indicate to the user which handheld tool and fasteners to use in the step illustrated in FIG. 4D.

Figure 4E:
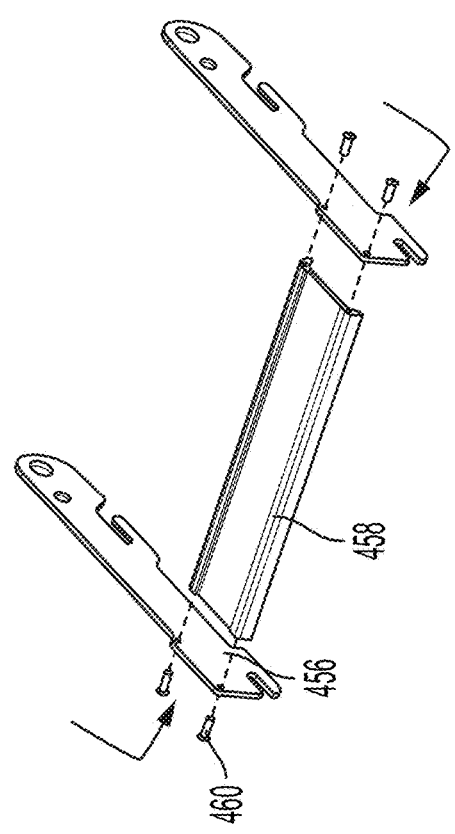

As mentioned above, the solar panel may comprise a stand for manipulating the angle at which the solar panel is oriented at during use. In some embodiments, the stand may be assembled using a pair of stand arms 456 and an arm connecting member 458 for connecting the pair of arms. Each of the arms 456 may comprise one or more through-holes configured to receive a removable fastener 460 for securing the arms to the connecting member 458. For example, the through-holes on each arm may be positioned on a flat surface of the arm, at an end of the arm, and proximate to an edge of the arm, as shown in FIG. 4E. In some embodiments, the connecting member 458 may comprise one or more receiving portions (e.g., sockets) configured to correspond with the one or more removable fasteners 460. For example, the user may connect a first arm 456 to the arm connecting member 458 by inserting one or more removable fasteners 460 through the through-holes in the arm and into the sockets in the connecting member and may secure the fasteners using a handheld tool. In some embodiments, removable fastener 460 may be a screw, and the sockets in the connecting member 458 may comprise threads configured to correspond with the screw. In some embodiments, the edges of connecting member 458 along a longitudinal axis of the connecting member may be raised, such that the end of the connecting member may comprise a pair of sockets extending within the raised edges. Thus, each arm 456 may be connected to the arm connecting member 458 using removable fasteners 460 in two locations, as illustrated in FIG. 4E.

In some embodiments, the one or more removable fasteners 460 and the handheld tool may be used to assemble the stand of the solar panel may be different from the removable fasteners and handheld tools described above with respect to assembling the solar light and the frame of the solar panel. In some embodiments, an instruction manual provided with the solar light kit may indicate the handheld tool and removable fasteners that may be used to assemble the stand. In some embodiments, the stand of the solar panel may be required to be assembled prior to attempting to connect the arms 456 to the corresponding portion of the framed solar panel assembly.

Figure 4G:
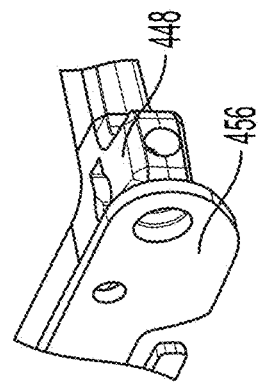
Figure 4F:
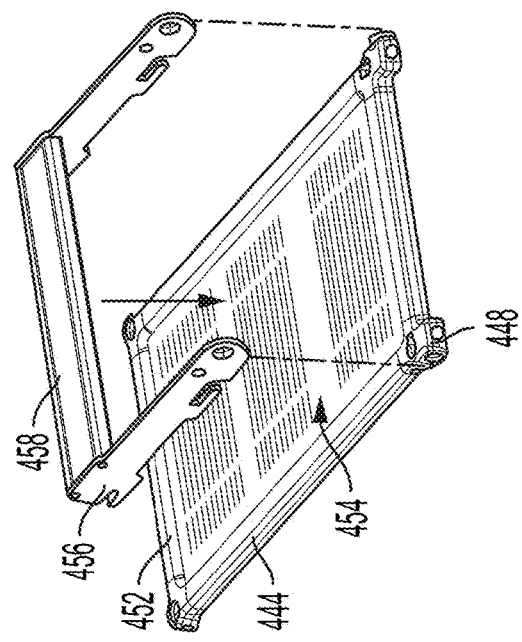
Figure 4H:
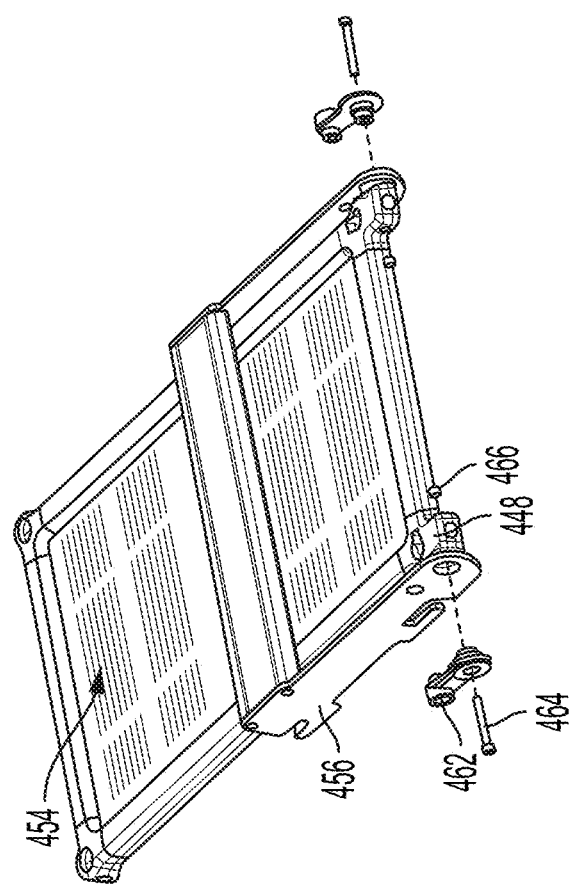

After assembling the solar panel stand, the assembled stand may be connected to the framed solar panel assembly (shown in FIG. 4F). As mentioned above, the corner members 448 may comprise a connecting portion for connecting the assembled stand to the solar panel assembly. For example, arms 456 may comprise one or more through-holes disposed at an end of the arm opposite from the end attached to the connecting member of the stand. In some embodiments, the through-holes may be different sizes; for example, a first through-hole may be larger than a second through-hole. One or more of the through-holes on each arm may be aligned with the connecting portion on each of the corner members 448 to connect the stand to the solar panel assembly, as shown in FIG. 4G. Once the through-holes of the arms are aligned with the connecting portions on corner members 448, the user may connect the stand to the solar panel assembly using one or more removable fasteners, one or more stand connectors 462, and a handheld tool, as illustrated in FIG. 4H.

In some embodiments, stand connector 462 may comprise one or more extruded portions configured to be received by the one or more through-holes on arm 456. In some embodiments, stand connector 462 may comprise a through-hole, wherein the through-hole may extend through an extruded portion of the stand connector. For example, stand connector 462 may comprise a larger extruded portion and a smaller extruded portion, each extruded portion configured to correspond with the large and small through-holes on arm 456, respectively. The through-hole on stand connector 462 may extend through the larger extruded portion that corresponds with the large through-hole on the arm 456. Thus, the user may insert the corresponding extruded portions of the stand connectors 462 into the through-holes in the arms (previously aligned with the connecting portion of the corner members 448) and may secure the components using a handheld tool and a removable fastener configured to be inserted through the through-hole in the stand connector, the through-hole in the arm, and a through-hole in the corner member 448 (in that order). In some embodiments, as may be indicated on the instructions received in the solar light kit, the handheld tool and fasteners used to connect the stand to the remainder of the solar panel assembly may be different from one or more handheld tools and/or fasteners described above.

In some embodiments, in securing the stand to the solar light using the stand connector 462 and the removable fastener 464, an additional fastener 466 configured to receive the end of fastener 464 may be disposed on a side of corner member 448 opposite from arm 456 to secure the components together. For example, removable fastener 466 may be a nut configured to receive a screw, such that when the screw is inserted through the stand connector 462, arm 456, and corner member 448, the screw may be secured using a nut 466 disposed on a side of corner member 448 opposite from where the screw was inserted. The steps described above with respect to FIG. 4H may be repeated a second time to secure the remaining corner of the solar light panel to the solar light stand. As mentioned above, the stand may be configured to fold up flat against the solar panel, as shown in FIG. 4H. In some embodiments, the position of the stand may be pivoted about the corner member 448 (e.g., about the axis through which removable fastener 464 may be inserted through stand connector 462, arm 456, and corner member 448). Thus, the user may manipulate the angle at which the assembled stand positions the solar panel device. In some embodiments, the angle may be set using stand connector 462. For example, an extruded portion on stand connector 462 (e.g., the smaller extruded portion described above) may be removably inserted into and removed from the corresponding portion in corner member 448 to set the angle at which the solar panel is stood.

Method for Assembling a Solar Light Device

FIG. 5 shows a method 500 for assembling a solar light from a solar light kit, in accordance with some embodiments.

At step 502, a first PCB comprising an array of light sources (e.g., light emitting diode (LED) arrays) and a set of leads and a second PCB comprising a plurality of electrical ports may be connected. In some embodiments, connecting the first PCB and second PCB may comprise aligning the set of leads on the first PCB with a first electrical port of the plurality of electrical ports on the second PCB and applying pressure between the first PCB and second PCB. In some embodiments, one or more electrical ports on the second PCB may be configured to charge a mobile device.

In some embodiments method 500 may include attaching a lens configured to disperse light from the array of light sources to the first PCB. In some embodiments, the first PCB may comprise a switch configured to activate and deactivate the one or more light sources. In some embodiments, the first PCB may comprise one or more through-holes configured to receive an electrical port on the second PCB when the first PCB and second PCB are connected.

In some embodiments, method 500 may comprise attaching an end cap to an end of the connected first PCB and second PCB, wherein, at step 504, the end of the connected PCBs opposite from the end comprising the end cap may be inserted into the PCB housing. In some embodiments, the first and second PCB may fit into the housing in a single orientation. For example, the connected PCBs may be inserted such that the one or more electrical ports on the second PCB may be oriented towards one or more corresponding openings on the PCB housing.

In some embodiments, the method 500 may comprise attaching an electrical port plate to the PCB housing by aligning the electrical port plate with a corresponding portion of the PCB housing and applying pressure between the electrical port plate and the PCB housing. In some embodiments, the electrical port plate may comprise a button configured to align and engage with a switch on the first PCB.

In some embodiments, the method 500 may comprise attaching an electrical port cover to the PCB housing by aligning the electrical port over with a corresponding portion of the PCB housing and applying pressure between a portion of the electrical port cover and the PCB housing. In some embodiments, the electrical port cover may comprise one or more electrical port caps configured to removably cover the one or more electrical ports on the second PCB.

In some embodiments, the method may include inserting a rechargeable battery into an end of a battery housing. In some embodiments, the rechargeable battery may be enclosed in the housing using one or more end caps. In some embodiments, enclosing the rechargeable battery may comprise inserting a portion of an end cap into the end of the battery housing by aligning the end cap with the end of the battery housing and applying pressure between the end cap and battery housing.

At step 506, the PCB housing comprising the connected first PCB and second PCB may be connected to the battery housing by aligning an end of the PCB housing with an end of the battery housing and applying pressure between the PCB housing and the battery housing. In some embodiments, connecting the PCB housing and the battery housing may comprise connecting a wire (e.g., lead) extending from the rechargeable battery to the connected PCBs in the PCB housing. In some embodiments, the end of the battery housing comprising one or more end caps may be configured to connect with an open end of the PCB housing.

In some embodiments, method 500 may include connecting a first end cap to a first end of a casing such that at step 508, the connected PCB housing and battery housing may be inserted into a second end of the casing. In some embodiments, the method may include connecting a second end cap to the second end of the casing. In some embodiments, the first end cap and second end cap may be connected to the casing using a plurality of removable fasteners and at least one handheld tool.

At step 510, a solar panel may be connected to the second PCB using a connector cable. In some embodiments, the connector cable may be removably connectable to the second PCB and the solar panel. In some embodiments, the solar panel may comprise a solar panel frame and a solar panel stand. In some embodiments, the solar panel frame may be assembled by connecting a plurality of corner members and a plurality of edge members configured to surround the perimeter of the solar panel. In some embodiments, the plurality of edge members and corner members may be connected using a plurality of removable fasteners and at least one handheld tool.

In some embodiments, the solar panel stand may be assembled using a pair of stand arms and an arm connecting member, wherein the arm connecting member is configured to connect to each arm to connect the arms. In some embodiments, the arms and connecting members may be assembled using a plurality of removable fasteners and at least one handheld tool. In some embodiments, the solar panel stand may be connected to the solar panel frame using one or more stand connectors, a plurality of removable fasteners, and at least one handheld tool. In some embodiments, each of the above described components may be provided unassembled in a solar light kit with instructions for assembling the solar light kit.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. Such modifications and variations are to be understood as being included within the scope of the disclosure and examples as defined by the claims. The embodiments were chosen and described in order to best explain the principles of the techniques and their practical applications. Others skilled in the art are thereby enabled to best utilize the techniques and various embodiments with various modifications as are suited to the particular use contemplated. For the purpose of clarity and a concise description, features are described herein as part of the same or separate embodiments; however, it will be appreciated that the scope of the disclosure includes embodiments having combinations of all or some of the features described.

The invention claimed is:

1. A method of assembling a solar light kit, comprising:
   connecting a first printed circuit board (PCB) comprising an array of light sources and a set of leads and a second PCB comprising a plurality of electrical ports, wherein connecting the first PCB and the second PCB comprises aligning the set of leads on the first PCB with a first electrical port of the plurality of electrical ports on the second PCB and applying pressure between the first PCB and second PCB;
   inserting the connected first PCB and second PCB to a PCB housing, wherein the connected first PCB and second PCB fit within the PCB housing in one orientation;
   connecting the PCB housing and a battery housing enclosing a rechargeable battery by aligning an end of the PCB housing with an end of the battery housing and applying pressure between the PCB housing and the battery housing;
   inserting the connected PCB housing and battery housing into a casing; and
   connecting a solar panel to a second electrical port of the plurality of electrical ports on the second PCB using a connector cable, wherein the connector cable is removably connectable to the solar panel and to the second electrical port.

2. The method of claim 1, comprising attaching a lens to the first printed circuit board (PCB), wherein the lens is configured to disperse light from the array of light sources on the first PCB.

3. The method of claim 1, comprising, prior to inserting the connected first printed circuit board (PCB) and second PCB into the PCB housing, attaching an end cap to an end of the connected first PCB and second PCB.

4. The method of claim 3, wherein inserting the connected first printed circuit board (PCB) and second PCB to the PCB housing comprises inserting an end of the connected first PCB and second PCB opposite from the end cap into the PCB housing.

5. The method of claim 1, comprising, prior to inserting the connected printed circuit board (PCB) housing and battery housing into the casing, attaching an electrical port plate to the PCB housing by aligning the electrical port plate with a corresponding portion of the PCB housing and applying pressure between the electrical port plate and the PCB housing.

6. The method of claim 1, comprising, prior to inserting the connected printed circuit board (PCB) housing and battery housing into the casing, attaching an electrical port cover to the PCB housing by aligning the electrical port cover with a corresponding portion of the PCB housing and applying pressure between a portion of the electrical port cover and the PCB housing.

7. The method of claim 1, wherein connecting the printed circuit board (PCB) housing and the battery housing comprises connecting a lead extending from the rechargeable battery to the connected first PCB and second PCB.

8. The method of claim 1, wherein assembling the solar light kit comprises assembling a solar panel stand and a solar panel frame.

9. The method of claim 8, wherein assembling the solar panel frame comprises connecting a plurality of corner members and a plurality of edge members around a perimeter of the solar panel.

10. The method of claim 8, wherein assembling the solar panel stand comprises connecting an arm connecting member to a pair of stand arms.

11. A solar light kit, comprising:
a printed circuit board (PCB) housing configured to enclose a first PCB and second PCB, wherein
the first PCB comprises an array of light sources and a set of leads and the second PCB comprises a plurality of electrical ports,
the first PCB and second PCB are configured to connect by aligning the set of leads on the first PCB with a first electrical port of the plurality of electrical ports on the second PCB and applying pressure between the first PCB and the second PCB, and
the connected first PCB and second PCB are configured to fit in the PCB housing in one orientation;
a battery housing configured to enclose at least one rechargeable battery, wherein the battery housing is configured to connect to the PCB housing by aligning an end of the PCB housing with an end of the battery housing and applying pressure between the PCB housing and the battery housing;
a casing configured to enclose the connected PCB housing and battery housing; and
a solar panel configured to connect to the second PCB using a connector cable, wherein
the connector cable is removably connectable to the solar panel and to the second electrical port on the second PCB, and
the PCB housing, the first PCB, the second PCB, the battery housing, the rechargeable battery, the casing, the solar panel, and the connector cable are bundled together unassembled in a kit package.

12. The solar light kit of claim 11, comprising a lens configured to attach to the first printed circuit board (PCB) to disperse light generated from the array of light sources on the first PCB.

13. The solar light kit of claim 11, wherein the first printed circuit board comprises a switch configured to activate and deactivate the array of light sources.

14. The solar light kit of claim 11, wherein a third electrical port of the plurality of electrical ports on the second printed circuit board is configured to charge a mobile device.

15. The solar light of claim 11, comprising an electrical port plate configured to attach to the printed circuit board (PCB) housing by aligning the electrical port plate with a corresponding portion of the PCB housing and applying pressure between the electrical port plate and the PCB housing.

16. The solar light kit of claim 15, wherein the electrical port plate comprises a button configured to align and engage with a switch on the first printed circuit board.

17. The solar light kit of claim 11, comprising an electrical port cover configured to attach to the printed circuit board (PCB) housing by aligning the electrical port cover with a corresponding portion of the PCB housing and applying pressure between a portion of the electrical port cover and the PCB housing.

18. The solar light kit of claim 17, wherein the electrical port cover comprises one or more electrical port caps configured to removably cover one or more electrical ports of the plurality of electrical ports on the second printed circuit board.

19. The solar light kit of claim 11, wherein the solar panel comprises a solar panel frame and a solar panel stand configured to be assembled.

20. The solar light kit of claim 11, wherein the kit package comprises a plurality of handheld tools and instructions for assembling the solar light kit.

* * * * *